US011063168B1

(12) United States Patent
Stan et al.

(10) Patent No.: US 11,063,168 B1
(45) Date of Patent: Jul. 13, 2021

(54) INVERTED MULTIJUNCTION SOLAR CELLS WITH DISTRIBUTED BRAGG REFLECTOR

(71) Applicant: SolAero Technologies Corp., Albuquerque, NM (US)

(72) Inventors: Mark A. Stan, Albuquerque, NM (US); Arthur Cornfeld, Sandy Springs, GA (US)

(73) Assignee: SolAero Technologies Corp., Albuquerque, NM (US)

(*) Notice: Subject to any disclaimer, the term of this patent is extended or adjusted under 35 U.S.C. 154(b) by 101 days.

(21) Appl. No.: 16/667,687

(22) Filed: Oct. 29, 2019

Related U.S. Application Data

(60) Division of application No. 13/872,663, filed on Apr. 29, 2013, now Pat. No. 10,541,349, which is a (Continued)

(51) Int. Cl.
  *H01L 31/0735* (2012.01)
  *H01L 31/0304* (2006.01)
  (Continued)

(52) U.S. Cl.
  CPC .... *H01L 31/0735* (2013.01); *H01L 31/03046* (2013.01); *H01L 31/041* (2014.12);
  (Continued)

(58) Field of Classification Search
  CPC ........... H01L 31/0687; H01L 31/06875; H01L 31/0725; H01L 31/0735; H01L 31/0304;
  (Continued)

(56) References Cited

U.S. PATENT DOCUMENTS 5,316,593 A * 5/1994 Olson ............... H01L 31/02168
  136/262
5,828,088 A * 10/1998 Mauk ..................... H01L 31/184
  257/98

(Continued)

FOREIGN PATENT DOCUMENTS

EP         1863099 A2 * 12/2007 ....... H01L 31/06875

OTHER PUBLICATIONS

Dimroth et al, Metamorphic Gayln1-yP/Ga1-xInxAs Tandem Solar Cells for Space and for Terrestrial Concentrator Applications at C >1000 Suns, 2001, Prog. Photovolt: Res. Appl.; 9:165-178 (Year: 2001).*

*Primary Examiner* — Andrew J Golden

(57) ABSTRACT

An inverted metamorphic multijunction solar cell comprising: an upper first solar subcell having a first band gap; a middle second solar subcell disposed adjacent to the upper first solar subcell and having a second band gap smaller than said first band gap; a graded interlayer disposed adjacent to the middle second solar subcell and having a band gap that remains constant throughout its thickness; a lower third solar subcell disposed adjacent to said graded interlayer and having a fourth band gap that is smaller than said second band gap such that said third solar subcell is lattice mismatched with respect to said second solar subcell; a back surface field (BSF) layer disposed directly adjacent to the base layer of said lower third solar subcell; at least one distributed Bragg reflector (DBR) layer disposed directly adjacent to the back surface field (BSF) layer.

17 Claims, 22 Drawing Sheets

Related U.S. Application Data continuation-in-part of application No. 12/337,043, filed on Dec. 17, 2008, now abandoned.

(51) Int. Cl.
  *H01L 31/041* (2014.01)
  *H01L 31/054* (2014.01)
  *H01L 31/0687* (2012.01)
  *H01L 31/18* (2006.01)

(52) U.S. Cl.
  CPC .... *H01L 31/0549* (2014.12); *H01L 31/06875* (2013.01); *H01L 31/1892* (2013.01)

(58) Field of Classification Search
  CPC ......... H01L 31/03042; H01L 31/03044; H01L 31/03046; H01L 31/0693; H01L 31/056; H01L 31/076; H01L 33/10; H01L 31/0549; H01L 31/02168; H01L 31/02167; H01L 31/041; H01L 31/1892
  USPC .................................................. 136/243–265
  See application file for complete search history.

(56) References Cited

U.S. PATENT DOCUMENTS

| | | | |
|---|---|---|---|
| 6,340,788 B1* | 1/2002 | King | H01L 31/0687 136/261 |
| 6,660,928 B1* | 12/2003 | Patton | H01L 31/0687 136/249 |
| 2001/0018924 A1* | 9/2001 | Hisamatsu | H01L 31/03046 136/249 |
| 2002/0117675 A1* | 8/2002 | Mascarenhas | H01L 31/0687 257/87 |
| 2002/0154675 A1* | 10/2002 | Deng | H01S 5/18311 372/96 |
| 2003/0070707 A1* | 4/2003 | King | H01L 31/0687 136/255 |
| 2004/0079408 A1* | 4/2004 | Fetzer | H01L 31/184 136/262 |
| 2004/0084694 A1* | 5/2004 | Fatemi | H01L 31/032 257/200 |
| 2004/0166681 A1* | 8/2004 | Iles | H01L 31/0687 438/689 |
| 2005/0155641 A1* | 7/2005 | Fafard | H01L 31/0687 136/249 |
| 2005/0247339 A1* | 11/2005 | Barnham | H01L 31/0735 136/262 |
| 2005/0274411 A1* | 12/2005 | King | H01L 31/0735 136/256 |
| 2006/0144435 A1* | 7/2006 | Wanlass | H01L 31/0687 136/249 |
| 2006/0162767 A1* | 7/2006 | Mascarenhas | H01L 31/03046 136/261 |
| 2006/0162768 A1* | 7/2006 | Wanlass | H01L 31/06875 136/262 |
| 2007/0113887 A1* | 5/2007 | Laih | H01L 31/02167 136/259 |
| 2008/0163920 A1* | 7/2008 | Meusel | H01L 31/03046 136/246 |

* cited by examiner

INVERTED MULTIJUNCTION SOLAR CELLS WITH DISTRIBUTED BRAGG REFLECTOR

This application is a divisional of U.S. patent application Ser. No. 13/872,663 filed Apr. 29, 2013, which is a continuation-in-part of application Ser. No. 12/337,043, filed Dec. 17, 2008.

All of the above applications are incorporated herein by reference in their entirety.

REFERENCE TO RELATED APPLICATIONS

This application is related to co-pending U.S. patent application Ser. No. 13/604,883, filed Sep. 6, 2012.

This application is related to co-pending U.S. patent application Ser. No. 13/569,794, filed Aug. 8, 2012.

This application is related to co-pending U.S. patent application Ser. No. 13/547,334, filed Jul. 12, 2012, now U.S. Pat. No. 9,018,519.

This application is related to co-pending U.S. patent application Ser. No. 13/440,331, filed Apr. 5, 2012.

This application is related to co-pending U.S. patent application Ser. No. 13/401,181, filed Feb. 21, 2012, now U.S. Pat. No. 9,117,966.

This application is related to co-pending U.S. patent application Ser. No. 12/844,673, filed Jul. 27, 2010.

This application is related to co-pending U.S. patent application Ser. No. 12/813,408, filed Jun. 10, 2010.

This application is related to U.S. patent application Ser. No. 12/775,946, filed May 7, 2010, now U.S. Pat. No. 8,187,907.

This application is related to co-pending U.S. patent application Ser. No. 12/756,926, filed Apr. 8, 2010.

This application is related to co-pending U.S. patent application Ser. No. 12/730,018, filed Mar. 23, 2010.

This application is related to co-pending U.S. patent application Ser. No. 12/716,814, filed Mar. 2, 2010, now U.S. Pat. No. 9,018,521.

This application is related to co-pending U.S. patent application Ser. No. 12/708,361, filed Feb. 18, 2010.

This application is related to co-pending U.S. patent application Ser. No. 12/673,241, filed Dec. 14, 2009.

This application is related to U.S. patent application Ser. No. 12/623,134, filed Nov. 20, 2009, now U.S. Pat. No. 8,378,281.

This application is related to co-pending U.S. patent application Ser. No. 12/544,001, filed Aug. 19, 2009.

This application is related to U.S. patent application Ser. No. 12/537,361, filed Aug. 7, 2009, now U.S. Pat. No. 8,263,856.

This application is related to U.S. patent application Ser. Nos. 12/401,137, 12/401,157, and 12/401,189, filed Mar. 10, 2009.

This application is related to U.S. patent application Ser. No. 12/362,201, filed Jan. 29, 2009, now U.S. Pat. No. 7,960,201.

This application is related to application Ser. Nos. 12/362,213 and 12/362,225, filed Jan. 29, 2009.

This application is related to U.S. patent application Ser. No. 12/337,014, filed Dec. 17, 2008, now U.S. Pat. No. 7,785,989.

This application is related to U.S. patent application Ser. Nos. 12/271,127 and 12/271,192, filed Nov. 14, 2008.

This application is related to U.S. patent application Ser. No. 12/267,812, filed Nov. 10, 2008, now U.S. Pat. No. 8,236,600.

This application is related to U.S. patent application Ser. No. 12/190,449, filed Aug. 12, 2008, now U.S. Pat. No. 7,741,146, and its divisional patent application Ser. No. 12/816,205, filed Jun. 15, 2010, now U.S. Pat. No. 8,039,291.

This application is related to U.S. patent application Ser. No. 12/187,477, filed Aug. 7, 2008, now U.S. Pat. No. 8,263,853.

This application is related to U.S. patent application Ser. No. 12/218,558, filed Jul. 16, 2008; and U.S. patent application Ser. No. 12/218,582, filed Jul. 16, 2008, and its divisional application Ser. No. 13/603,088, filed Sep. 4, 2012.

This application is related to co-pending U.S. patent application Ser. No. 12/123,864, filed May 20, 2008.

This application is related to U.S. patent application Ser. No. 12/023,772, filed Jan. 31, 2008.

This application is related to U.S. patent application Ser. No. 11/956,069, filed Dec. 13, 2007, and its divisional U.S. patent application Ser. No. 12/187,454, filed Aug. 7, 2008, now U.S. Pat. No. 7,727,795.

This application is related to co-pending U.S. patent application Ser. Nos. 11/860,142 and 11/860,183, filed Sep. 24, 2007.

This application is related to co-pending U.S. patent application Ser. No. 11/445,793, filed Jun. 2, 2006.

This application is related to U.S. patent application Ser. No. 11/500,053, filed Aug. 7, 2006, and its divisional U.S. patent application Ser. No. 12/417,367, filed Apr. 2, 2009.

GOVERNMENT RIGHTS STATEMENT

This invention was made with government support under Contract No. FA9453-06-C-0345 awarded by the U.S. Air Force. The Government has certain rights in the invention.

BACKGROUND OF THE INVENTION

1. Field of the Invention

The present invention related to the field of semiconductor devices, and to fabrication processes and devices such as multijunction solar cells based on III-V semiconductor compounds including a metamorphic layer. Such devices are also known as inverted metamorphic multijunction solar cells.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500$\lambda$), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided. Thus, as payloads become more sophisticated, the power-to-weight ratio of a solar cell becomes increasingly more important, and there is increasing interest in lighter weight, "thin film" type solar cells having both high efficiency and low mass.

Typical III-V compound semiconductor solar cells are fabricated on a semiconductor wafer in vertical, multijunction structures. The individual solar cells or wafers are then disposed in horizontal arrays, with the individual solar cells connected together in an electrical series circuit. The shape and structure of an array, as well as the number of cells it contains, are determined in part by the desired output voltage and current.

Inverted metamorphic solar cell structures based on III-V compound semiconductor layers, such as described in M. W. Wanlass et al., Lattice Mismatched Approaches for High Performance, III-V Photovoltaic Energy Converters (Conference Proceedings of the 31st IEEE Photovoltaic Specialists Conference, Jan. 3-7, 2005, IEEE Press, 2005), present an important conceptual starting point for the development of future commercial high efficiency solar cells. However, the materials and structures for a number of different layers of the cell proposed and described in such reference present a number of practical difficulties, particularly relating to the most appropriate choice of materials and fabrication steps.

Prior to the inventions described in this and the related applications noted above, the materials and fabrication steps disclosed in the prior art have not been adequate to produce a commercially viable and energy efficient inverted metamorphic multijunction solar cell using commercially established fabrication processes.

SUMMARY OF THE INVENTION

Briefly, and in general terms, the present disclosure provides a method of manufacturing an inverted metamorphic multijunction solar cell comprising: providing a first substrate; depositing on the first substrate a sequence of layers of semiconductor material forming a solar cell comprising a plurality of subcells each of which comprises in order an emitter layer and a base layer, wherein the sequence of layers further comprises a back surface field (BSF) layer directly adjacent an edge of the base layer of at least one subcell, and at least one distributed Bragg reflector (DBR) layer directly adjacent the BSF layer; mounting and bonding a surrogate substrate on top of the sequence of layers; and removing the first substrate to provide a top surface of an inverted metamorphic multijunction solar cell in which light can enter and pass through one or more subcells including at least one subcell having the directly adjacent BSF and DBR layers and be reflected back into the at least one subcell by the DBR layer, wherein depositing the sequence of layers comprises: forming a first subcell comprising a first semiconductor material with a first band gap and a first lattice constant; forming a second subcell comprising a second semiconductor material with a second band gap and a second lattice constant, wherein the second band gap is less than the first band gap and the second lattice constant is greater than the first lattice constant; and forming a lattice constant transition material positioned between the first subcell and the second subcell using a metal organic chemical vapor deposition (MOCVD) reactor, said lattice constant transition material having a lattice constant that changes gradually from the first lattice constant to the second lattice constant, and wherein the band gap of the transition material remains constant throughout its thickness. In certain embodiments, the transition material is composed of $(In_xGa_{1-x})_yAl_{1-y}As$ with x and y selected such that the band gap of each interlayer remains constant throughout its thickness; and said transition material is deposited using trimethylgallium, trimethylindium, and arsine as precursor compounds in an MOCVD process, preferably with a process time for depositing the transition material of less than 45 minutes.

In another aspect, the present disclosure provides a method of forming an inverted metamorphic multijunction solar cell including an upper subcell, a middle subcell, and a lower subcell comprising: providing a first substrate for the epitaxial growth of semiconductor material; forming an upper first solar subcell on said first substrate, wherein said upper first solar cell has a first band gap; forming a middle second solar subcell comprising in order an emitter layer and a base layer over said first solar subcell, wherein said middle second solar subcell has a second band gap smaller than said first band gap; forming a back surface field (BSF) layer directly adjacent the base layer of said middle second solar cell; forming at least one distributed Bragg reflector layer directly adjacent the back surface field (BSF) layer that is directly adjacent the base layer of said middle second solar subcell; forming a graded interlayer over the at least one distributed Bragg reflector layer using an MOCVD process, wherein the band gap of the interlayer remains constant throughout its thickness; forming a lower third solar subcell over said graded interlayer having a fourth band gap smaller than said second band gap such that said third subcell is lattice mismatched with respect to said second subcell; mounting a surrogate second substrate over said third solar subcell; and removing said first substrate to provide a top surface of an inverted metamorphic multijunction solar cell in which light can enter the top subcell, pass through the middle subcell and the directly adjacent back surface field (BSF) layer, and be reflected by the at least one directly adjacent distributed Bragg reflector layer back into the middle subcell. In some embodiments the graded interlayer is compositionally graded to lattice match the middle subcell on one side and the lower subcell on the other side, and is composed of $(In_xGa_{1-x})_y Al_{1-y}As$ with x and y selected such that the band gap of the interlayer remains constant throughout its thickness and greater than said second band gap; and said transition material is deposited using trimethylgallium, trimethylindium, and arsine as precursor compounds in an MOCVD process, preferably with a process time for depositing the transition material of less than 45 minutes.

In another aspect, the present disclosure provides a method of manufacturing an inverted multijunction solar cell comprising: providing a first substrate; depositing on the first substrate a sequence of layers of semiconductor material using an MOCVD process to form a solar cell comprising a plurality of subcells each of which comprises in order an emitter layer and a base layer, wherein the sequence of layers further comprises a back surface field (BSF) layer directly adjacent an edge of the base layer of at least one subcell, and at least one distributed Bragg reflector (DBR) layer directly adjacent the BSF layer; mounting and bonding a surrogate substrate on top of the sequence of layers; and removing the first substrate to provide a top surface of an inverted multijunction solar cell in which light can enter and pass through one or more subcells including at least one subcell having the directly adjacent BSF and DBR layers and be reflected back into the at least one subcell by the DBR layer, wherein the Bragg reflector layer increases the radiation hardness of the solar cell by reducing the diffusion length necessary for collection in the at least one subcell having the directly adjacent BSF and DBR layers.

BRIEF DESCRIPTION OF THE DRAWING

The invention will be better and more fully appreciated by reference to the following detailed description when considered in conjunction with the accompanying drawings, wherein.

DESCRIPTION OF THE PREFERRED EMBODIMENTS

Figure 1:
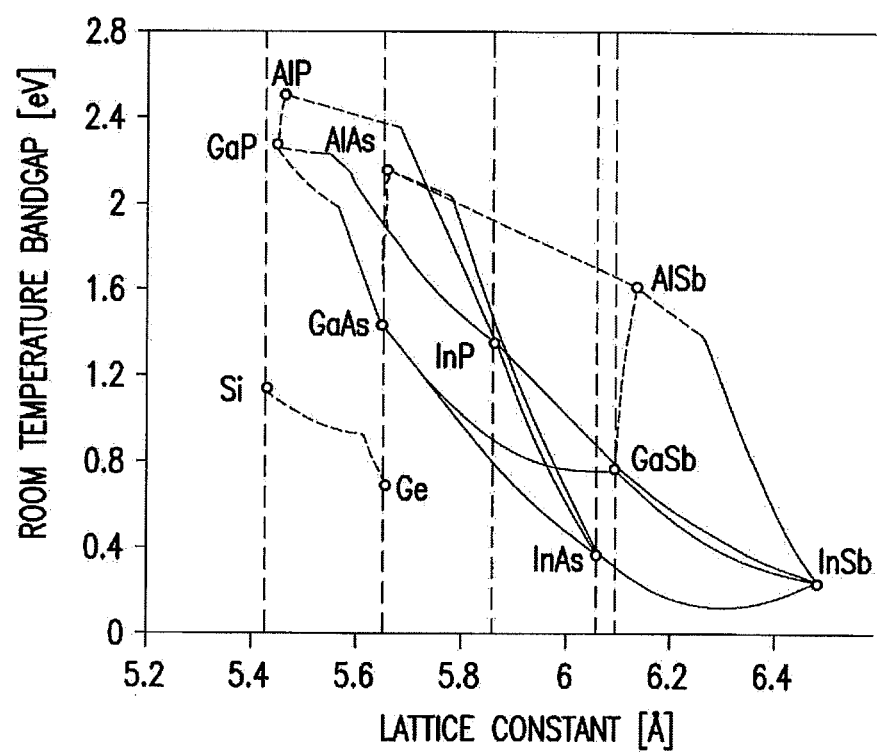
FIG. 1 is a graph representing the band gap of certain binary materials and their lattice constants.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The basic concept of fabricating an inverted metamorphic multijunction (IMM) solar cell is to grow the subcells of the solar cell on a substrate in a "reverse" sequence. That is, the high band gap subcells (i.e. subcells with band gaps in the range of 1.8 to 2.1 eV), which would normally be the "top" subcells facing the solar radiation, are grown epitaxially on a semiconductor growth substrate, such as for example GaAs or Ge, and such subcells are therefore lattice matched to such substrate. One or more lower band gap middle subcells (i.e. with band gaps in the range of 1.2 to 1.8 e V) can then be grown on the high band gap subcells.

At least one lower subcell is formed over the middle subcell such that the at least one lower subcell is substantially lattice mismatched with respect to the growth substrate and such that the at least one lower subcell has a third lower band gap (i.e. a band gap in the range of 0.7 to 1.2 eV). A surrogate substrate or support structure is then attached or provided over the "bottom" or substantially lattice mismatched lower subcell, and the growth semiconductor substrate is subsequently removed. (The growth substrate may then subsequently be re-used for the growth of a second and subsequent solar cells).

A variety of different features and aspects of inverted metamorphic multijunction solar cells are disclosed in the related applications noted above. Some or all of such features may be included in the structures and processes associated with the solar cells of the present invention. In particular, the present invention is directed to the inclusion of one or more distributed Bragg reflector (DBR) layers adjacent the base of one or more subcells. One advantage of such a structure is to increase radiation hardness by reducing the diffusion length necessary for collection. In the embodiment of the present invention, the DBR layer is composed of alternating layers of lattice matched p type material with discontinuities in their respective indices of refraction.

It should be apparent to one skilled in the art, that in addition to the DBR layers, additional types of semiconductor layers within the cell is also within the scope of the present invention.

FIG. 1 is a graph representing the band gap of certain binary materials and their lattice constants. The band gap and lattice constants of ternary materials are located on the lines drawn between typical associated binary materials (such as the ternary material GaAlAs being located between the GaAs and AlAs points on the graph, with the band gap of the ternary material lying between 1.42 eV for GaAs and 2.16 e V for AlAs depending upon the relative amount of the individual constituents). Thus, depending upon the desired band gap, the material constituents of ternary materials can be appropriately selected for growth.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), Molecular Beam Epitaxy (MBE), or other vapor deposition methods for the reverse growth may enable the layers in the monolithic semiconductor structure forming the cell to be grown with the required thickness, elemental composition, dopant concentration and grading and conductivity type. In some embodiments, layers of the semiconductor structure can be deposited using an MOCVD reactor with appropriate precursor compounds (e.g., trimethylgallium, trimethylindium, and/or arsine). Advantageously, using such an MOCVD process can allow for deposition of a layer of the semiconductor structure with a process time of, for example, less than 45 minutes.

Figure 2:
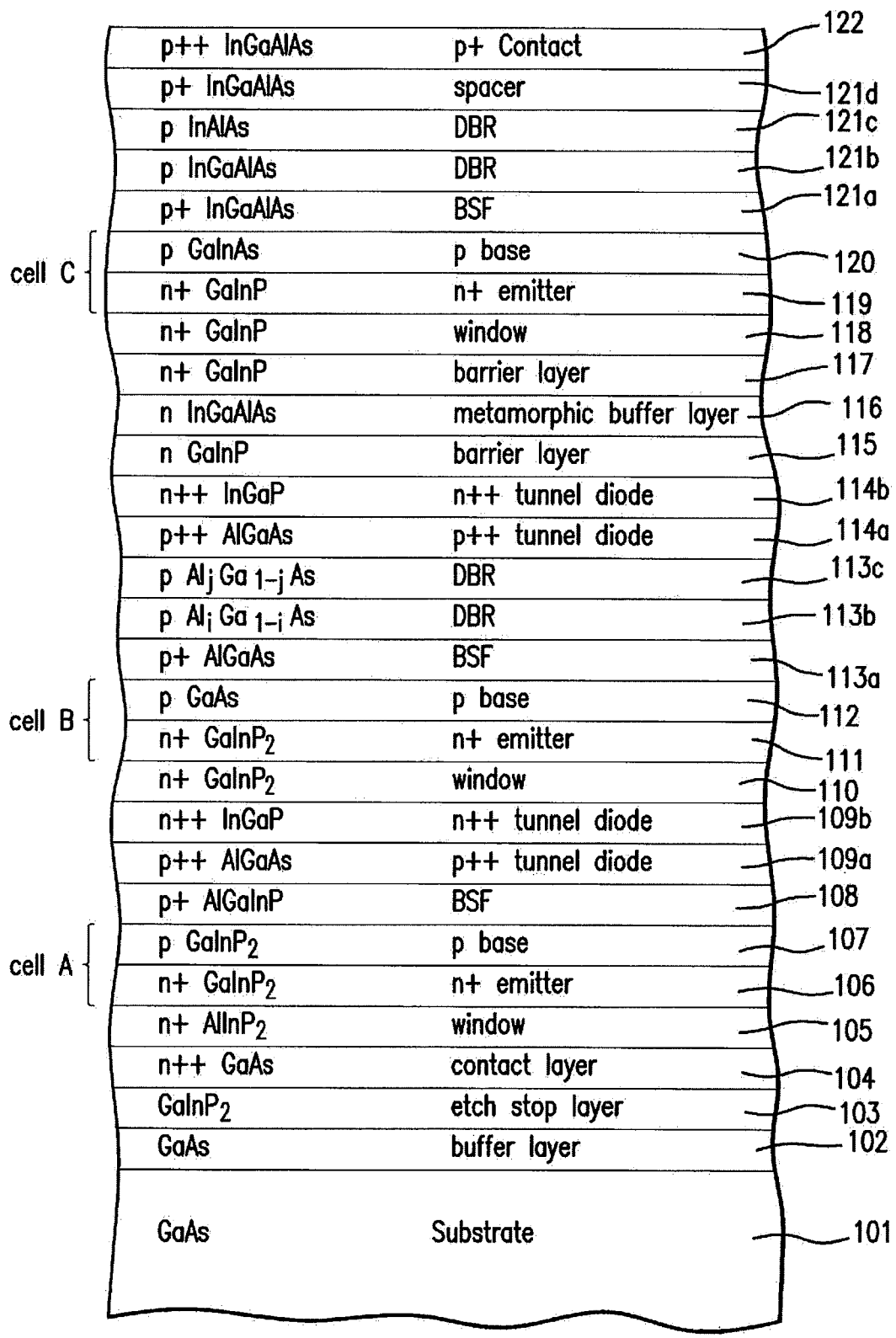
FIG. 2 is a cross-sectional view of the solar cell of the invention after the deposition of semiconductor layers on the growth substrate.

FIG. 2 depicts the multijunction solar cell according to the present invention after the sequential formation of the three subcells A, B and C on a GaAs growth substrate. More particularly, there is shown a substrate 101, which is preferably gallium arsenide (GaAs), but may also be germanium (Ge) or other suitable material. For GaAs, the substrate is preferably a 15° off-cut substrate, that is to say, its surface is orientated 15° off the (100) plane towards the (111)A plane, as more fully described in U.S. Patent Application Pub. No. 2009/0229662 A1 (Stan et al.).

In the case of the Ge substrate, a nucleation layer (not shown) is deposited directly on the substrate 101. On the substrate, or over the nucleation layer (in the case of a Ge substrate), a buffer layer 102 and an etch stop layer 103 are further deposited. In the case of GaAs substrate, the buffer layer 102 is preferably GaAs. In the case of Ge substrate, the buffer layer 102 is preferably InGaAs. A contact layer 104 of GaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally lattice matched to the growth substrate 101.

It should be noted that the multijunction solar cell structure could be formed by any suitable combination of group III to V elements listed in the periodic table subject to lattice constant and band gap requirements, wherein the group III includes boron (B), aluminum (Al), gallium (Ga), indium (In), and thallium (Tl). The group IV includes carbon (C), silicon (Si), germanium (Ge), and tin (Sn). The group V includes nitrogen (N), phosphorus (P), arsenic (As), antimony (Sb), and bismuth (Bi).

In one embodiment, the emitter layer 106 is composed of InGa(Al)P and the base layer 107 is composed of InGa(Al)P. The aluminum or Al term in parenthesis in the preceding formula means that Al is an optional constituent, and in this instance may be used in an amount ranging from 0% to 30%. The doping profile of the emitter and base layers 106 and 107 according to the present invention will be discussed in conjunction with FIG. 16.

Subcell A will ultimately become the "top" subcell of the inverted metamorphic structure after completion of the process steps according to the present invention to be described hereinafter.

On top of the base layer 107 a back surface field ("BSF") layer 108 preferably p+AlGaInP is deposited and used to reduce recombination loss.

The BSF layer 108 drives minority carriers from the region near the base/BSF interface surface to minimize the effect of recombination loss. In other words, the BSF layer 108 reduces recombination loss at the backside of the solar subcell A and thereby reduces the recombination in the base.

On top of the BSF layer 108 is deposited a sequence of heavily doped p-type and n-type layers 109a and 109b that forms a tunnel diode, i.e. an ohmic circuit element that connects subcell A to subcell B. Layer 109a is preferably composed of p++ AlGaAs, and layer 109b is preferably composed of n++ InGaP.

On top of the tunnel diode layers 109 a window layer 110 is deposited, preferably n+ InGaP. The advantage of utilizing InGaP as the material constituent of the window layer 110 is that it has an index of refraction that closely matches the adjacent emitter layer 111, as more fully described in U.S. Patent Application Pub. No. 2009/0272430 A1 (Comfeld et al.). More generally, the window layer 110 used in the subcell B operates to reduce the interface recombination loss. It should be apparent to one skilled in the art, that additional layer(s) may be added or deleted in the cell structure without departing from the scope of the present invention.

On top of the window layer 110 the layers of subcell B are deposited: the n-type emitter layer 111 and the p-type base layer 112. These layers are preferably composed of InGaP and $In_{0.015}GaAs$ respectively (for a Ge substrate or growth template), or InGaP and GaAs respectively (for a GaAs substrate), although any other suitable materials consistent with lattice constant and band gap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 111 and 112 according to the present invention will be discussed in conjunction with FIG. 16.

In previously disclosed implementations of an inverted metamorphic solar cell, the middle cell was a homostructure. In the present invention, similarly to the structure disclosed in U.S. Patent Application Pub. No. 2009/0078310 A1 (Stan et al.), the middle subcell becomes a heterostructure with an InGaP emitter and its window is converted from InAlP to InGaP. This modification eliminated the refractive index discontinuity at the window/emitter interface of the middle sub-cell. Moreover, the window layer 110 is preferably doped three times that of the emitter 111 to move the Fermi level up closer to the conduction band and therefore create band bending at the window/emitter interface which results in constraining the minority carriers to the emitter layer.

In one embodiment of the present invention, the middle subcell emitter has a band gap equal to the top subcell emitter, and the bottom subcell emitter has a band gap greater than the band gap of the base of the middle subcell. Therefore, after fabrication of the solar cell, and implementation and operation, neither the emitters of middle subcell B nor the bottom subcell C will be exposed to absorbable radiation. Substantially all of the photons representing absorbable radiation will be absorbed in the bases of cells B and C, which have narrower band gaps than the emitters. Therefore, the advantages of using heterojunction subcells are: (i) the short wavelength response for both subcells will improve, and (ii) the bulk of the radiation is more effectively absorbed and collected in the narrower band gap base. The effect will be to increase the short circuit current $J_{sc}$.

On top of the cell B is deposited a p+ type AlGaAs BSF layer 113a which performs the same function as the BSF layer 109.

On top of the BSF layer 113a, a first distributed Bragg reflector (DBR) layer 113b is deposited. A Bragg grating is essentially a sequence of uniformly spaced layers with a partially reflective interface between layers. In the embodiment of the present invention, the D BR layer 113b is composed of alternating layers of lattice matched materials with discontinuities in their respective indices of refraction. The difference in refractive index is maximized in order to minimize the number of periods required to achieve a given reflectivity. The thickness and refractive index of each period determines the stop band and its limiting wavelength. The first DBR layer 1 13b is composed of p type AlGaAs, or more specifically $Al_xGa_{1-x}As$. The second DBR layer 113c, disposed over layer 113b, is also composed of p type AlGaAs, or more specifically $Al_yGa_{1-y}As$, where y is greater than x, i.e. the amount of the Al mole fraction in layer 113c is greater than that in the layer 113b. In order not to increase the thickness of the solar cell, the thickness of the base layer 112 is preferably reduced by an amount approximately equal to the thickness of the DBR layers 113b and 113c.

The incorporation of a DBR layer "below" the BSF layer (as seen from the direction of incident light entering the solar cell at the top subcell A, and continuing through subcell B) with an appropriate stop band and cut-off wavelength is expected to increase the short circuit current by maintaining or exceeding the absorption volume.

The p++/n++ tunnel diode layers 114a and 114b respectively, similar to the layers 109a and 109b, are deposited over the DBR layer 113c, forming an ohmic circuit element to connect subcell B to subcell C. The layer 114a is preferably composed of p++ AlGaAs, and layer 114b is preferably composed of n++ InGaP.

A barrier layer 115, preferably composed of n-type InGa(Al)P, is deposited over the tunnel diode 114a/114b, to a thickness of about 1.0 micron. Such barrier layer is intended to prevent threading dislocations from propagating, either opposite to the direction of growth into the middle and top subcells B and A, or in the direction of growth into the bottom subcell C, and is more particularly described in copending U.S. Patent Application Pub. No. 2009/0078309 A1 (Cornfeld et al.).

A metamorphic layer (or graded interlayer) 116 is deposited over the barrier layer 115 using a surfactant. Layer 116 is preferably a compositionally step-graded series of InGaAlAs layers, preferably with monotonically changing lattice constant, so as to achieve a gradual transition in lattice constant in the semiconductor structure from subcell B to subcell C while minimizing threading dislocations from occurring. The band gap of layer 116 is constant throughout its thickness, preferably approximately equal to 1.5 eV, or otherwise consistent with a value slightly greater than the band gap of the middle subcell B. One embodiment of the graded interlayer may also be expressed as being composed of $(In_xGa_{1-x})_yAl_{1-y}As$, with x and y selected such that the band gap of the interlayer remains constant at approximately 1.50 eV or other appropriate band gap.

In the surfactant assisted growth of the metamorphic layer 116, a suitable chemical element is introduced into the reactor during the growth of layer 116 to improve the surface characteristics of the layer. In one embodiment, such element may be a dopant or donor atom such as selenium (Se) or tellurium (Te). Small amounts of Se or Te are therefore incorporated in the metamorphic layer 116, and remain in the finished solar cell. Although Se or Te are exemplary n-type dopant atoms, other non-isoelectronic surfactants may be used as well.

Surfactant assisted growth results in a much smoother or planarized surface. Since the surface topography affects the bulk properties of the semiconductor material as it grows and the layer becomes thicker, the use of the surfactants minimizes the threading dislocations in the active regions, and therefore improves overall solar cell efficiency.

As an alternative to the use of non-isoelectronic surfactants, one may use an isoelectronic surfactant. The term "isoelectronic" refers to surfactants such as antimony (Sb) or bismuth (Bi), since such elements have the same number of valence electrons as the P atom of InGaP, or the As atom in InGaAlAs, in the metamorphic buffer layer. Such Sb or Bi surfactants will not typically be incorporated into the metamorphic layer 116.

In an alternative embodiment where the solar cell has only two subcells, and the "middle" cell B is the uppermost or top subcell in the final solar cell, wherein the "top" subcell B would typically have a band gap of 1.8 to 1.9 eV, then the band gap of the interlayer would remain constant at 1.9 eV.

In the inverted metamorphic structure described in the Wanlass et al. paper cited above, the metamorphic layer consists of nine compositionally graded InGaP steps, with each step layer having a thickness of 0.25 micron. As a result, each layer of Wanlass et al. has a different band gap. In one embodiment of the present invention, the layer 116 is composed of a plurality of layers of InGaAlAs, with monotonically changing lattice constant, each layer having the same band gap, approximately 1.5 eV.

The advantage of utilizing a constant band gap lattice constant transition material such as InGaAlAs is that arsenide-based semiconductor material is much easier to process in standard commercial MOCVD reactors, while the small amount of aluminum assures radiation transparency of the metamorphic layers. The use of a vapor deposition method such as Metal Organic Chemical Vapor Deposition (MOCVD) may enable the lattice constant transition material to be grown with the required thickness, elemental composition, and grading. In some embodiments, the lattice constant transition material can be deposited using an MOCVD reactor with appropriate precursor compounds (e.g., trimethylgallium, trimethylindium, and/or arsine). Advantageously, using such an MOCVD process can allow for deposition of the lattice constant transition material with a process time of, for example, less than 45 minutes.

Although one embodiment of the present invention utilizes a plurality of layers of InGaAlAs for the metamorphic layer 116 for reasons of manufacturability and radiation transparency, other embodiments of the present invention may utilize different material systems to achieve a change in lattice constant from subcell B to subcell C. Thus, the system of Wanlass using compositionally graded InGaP is a second embodiment of the present invention. Other embodiments of the present invention may utilize continuously graded, as opposed to step graded, materials. More generally, the graded interlayer may be composed of any of the As, N, Sb based III-V compound semiconductors subject to the constraints of having the in-plane lattice parameter greater or equal to that of the second solar cell and less than or equal to that of the third solar cell, and having a band gap energy greater than that of the second solar cell.

In another embodiment of the present invention, an optional second barrier layer 117 may be deposited over the InGaAlAs metamorphic layer 116. The second barrier layer 117 will typically have a different composition than that of barrier layer 115, and performs essentially the same function of preventing threading dislocations from propagating. In one embodiment, barrier layer 117 is n+ type GaInP.

A window layer 118 preferably composed of n+ type GaInP is then deposited over the barrier layer 117 (or directly over layer 116, in the absence of a second barrier layer). This window layer operates to reduce the recombination loss in subcell "C". It should be apparent to one skilled in the art that additional layers may be added or deleted in the cell structure without departing from the scope of the present invention.

On top of the window layer 118, the layers of cell C are deposited: the n+ emitter layer 119, and the p-type base layer 120. These layers are preferably composed of n+ type InGaAs and n+ type InGaAs respectively, or n+ type InGaP and p type InGaAs for a heterojunction subcell, although other suitable materials consistent with lattice constant and band gap requirements may be used as well. The doping profile of layers 119 and 120 will be discussed in connection with FIG. 16.

A BSF layer 121a, preferably composed of p+ type InGaAlAs, is then deposited on top of the cell C, the BSF layer performing the same function as the BSF layers 108 and 113.

On top of the BSF layer 121a, a third distributed Bragg reflector (DBR) layer 121b is deposited. In the embodiment of the present invention, the DBR layer 121b is composed of alternating layers (121b and 121c) of lattice matched p type InGaAlAs material with discontinuities in their respective indices of refraction. The difference in refractive index is maximized in order to minimize the number of periods required to achieve a given reflectivity. The thickness and refractive index of each period determines the stop band and its limiting wavelength. The fourth DBR layer 121c, disposed over layer 121b, is composed of p type InAlAs. In order not to increase the thickness of the solar cell, the thickness of the base layer 120 is preferably reduced by an amount approximately equal to the thickness of the DBR composed of alternating layers 121 band 121c.

On top of the DBR layer 121c, a spacer layer 121d preferably composed of InGaAlAs is deposited.

Finally a high band gap contact layer 122, preferably composed of InGaAlAs, is deposited on the space layer 121d.

This contact layer 122 added to the bottom (non-illuminated) side of a lower band gap photovoltaic subcell, in a multijunction photovoltaic cell, can be formulated to reduce absorption of the light that passes through the cell, so that (i) an ohmic metal contact layer below (non-illuminated side) it will also act as a mirror layer, and (ii) the contact layer doesn't have to be selectively etched off, to prevent absorption.

It should be apparent to one skilled in the art, that additional layer(s) may be added or deleted in the cell structure without departing from the scope of the present invention.

Figure 3:
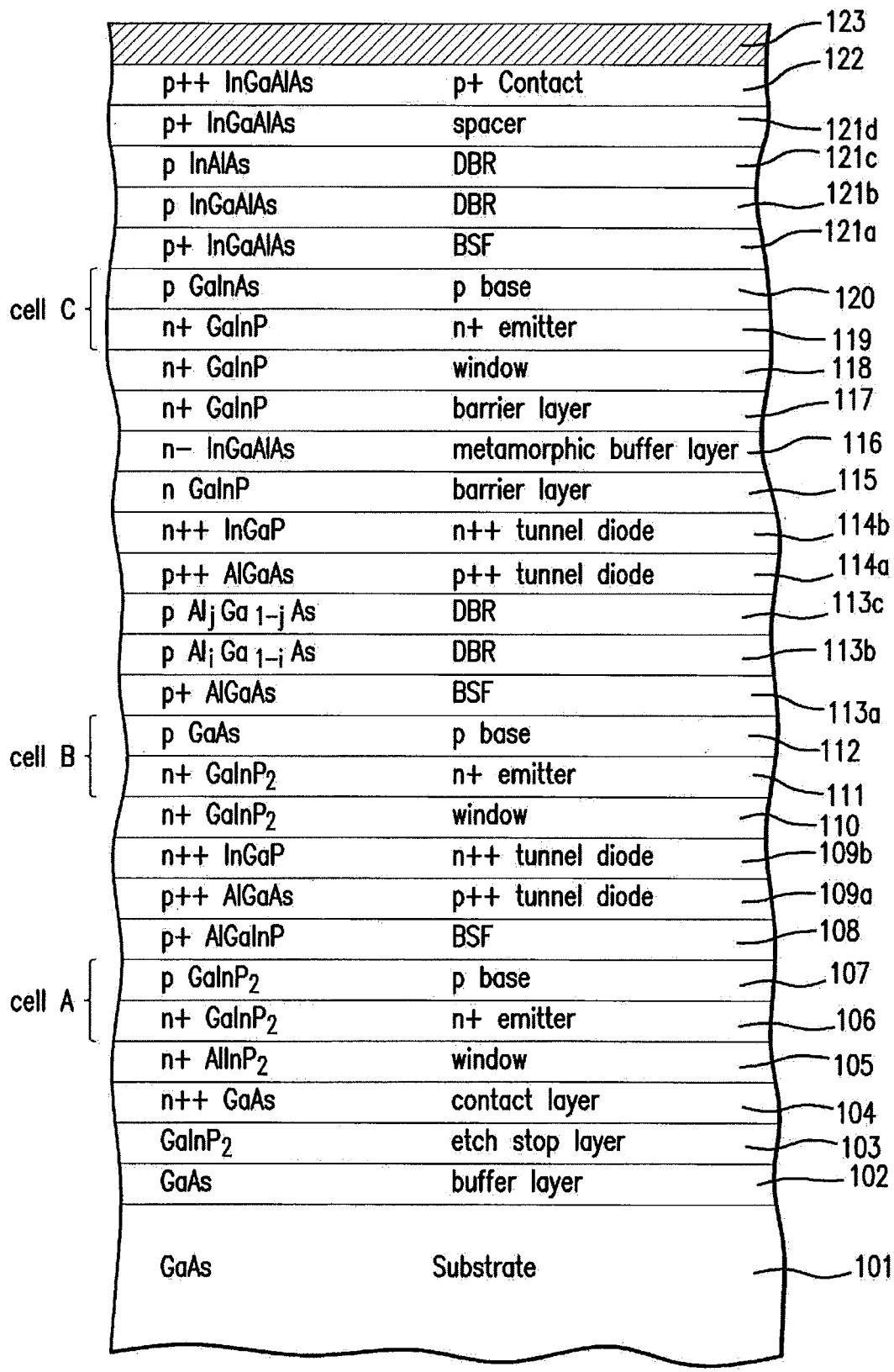
FIG. 3 is a cross-sectional view of the solar cell of FIG. 2 after the next process step.

FIG. 3 is a cross-sectional view of the solar cell of FIG. 2 after the next process step in which a metal contact layer 123 is deposited over the p+ semiconductor contact layer 122. The metal is preferably the sequence of metal layers Ti/Au/Ag/Au.

Also, the metal contact scheme chosen is one that has a planar interface with the semiconductor, after heat treatment to activate the ohmic contact. This is done so that (i) a dielectric layer separating the metal from the semiconductor doesn't have to be deposited and selectively etched in the metal contact areas; and (ii) the contact layer is specularly reflective over the wavelength range of interest.

Figure 4:
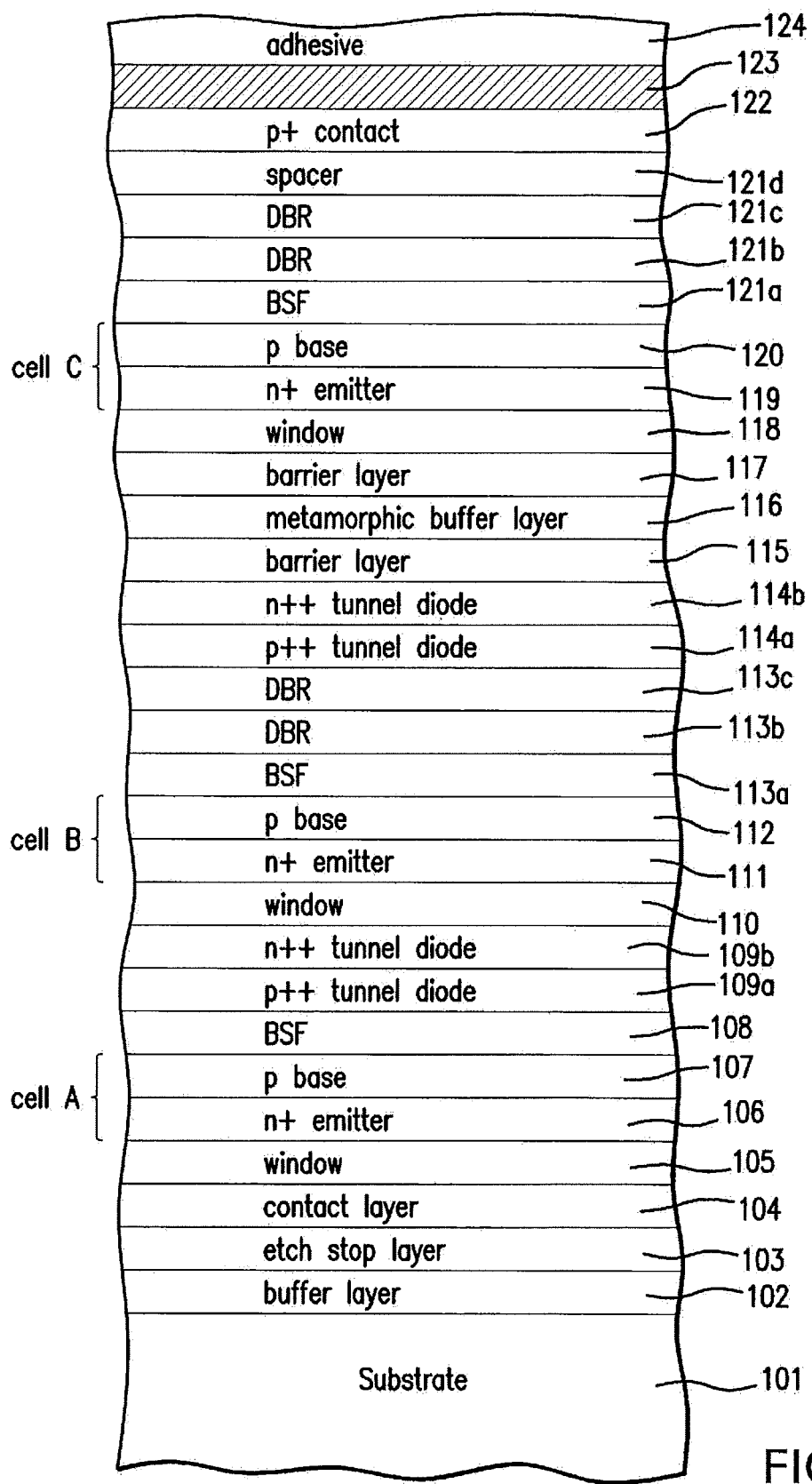
FIG. 4 is a cross-sectional view of the solar cell of FIG. 3 after the next process step.

FIG. 4 is a cross-sectional view of the solar cell of FIG. 3 after the next process step in which a bonding layer 124 is deposited over the metal layer 123. In one embodiment of the present invention, the bonding layer is an adhesive, preferably Wafer Bond (manufactured by Brewer Science, Inc. of Rolla, Mo.). In other embodiments of the present invention, a solder or eutectic bonding layer 124, such as described in U.S. Patent Application Pub. No. 2010/0122764 A1 (Newman), or a bonding layer 124 such as such as described in U.S. patent application Ser. No. 12/265,113 filed Nov. 5, 2008, may be used, where the surrogate substrate remains a permanent component of the solar cell.

Figure 5A:
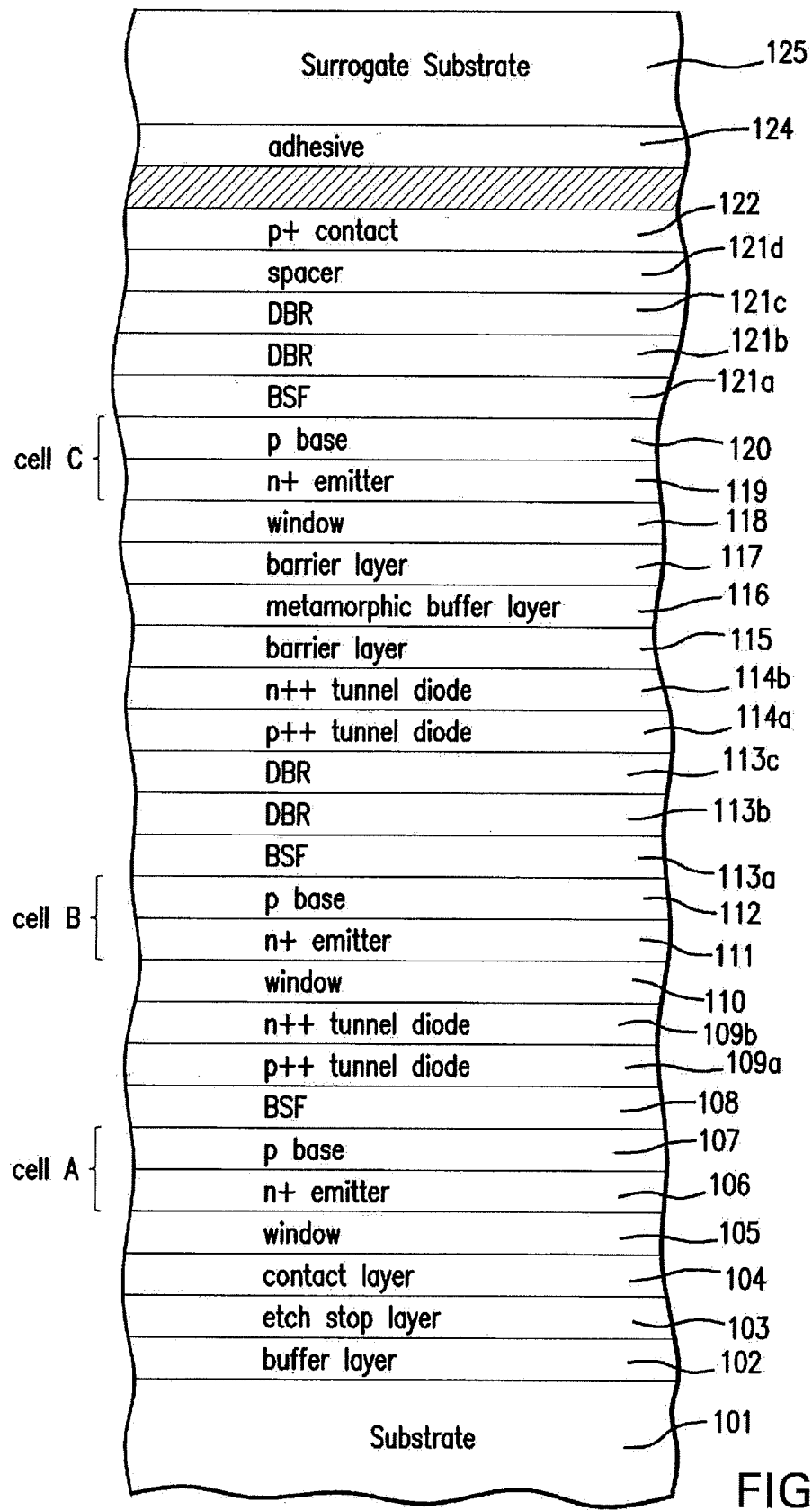
FIG. 5A is a cross-sectional view of the solar cell of FIG. 4 after the next process step in which a surrogate substrate is attached.

FIG. 5A is a cross-sectional view of the solar cell of FIG. 4 after the next process step in which a surrogate substrate 125, preferably sapphire, is attached. Alternatively, the surrogate substrate may be GaAs, Ge or Si, or other suitable material. The surrogate substrate is about 40 mils in thickness, and in the case of embodiments in which the surrogate substrate is to be removed, it is perforated with holes about 1 mm in diameter, spaced 4 mm apart, to aid in subsequent removal of the adhesive and the substrate.

Figure 5B:
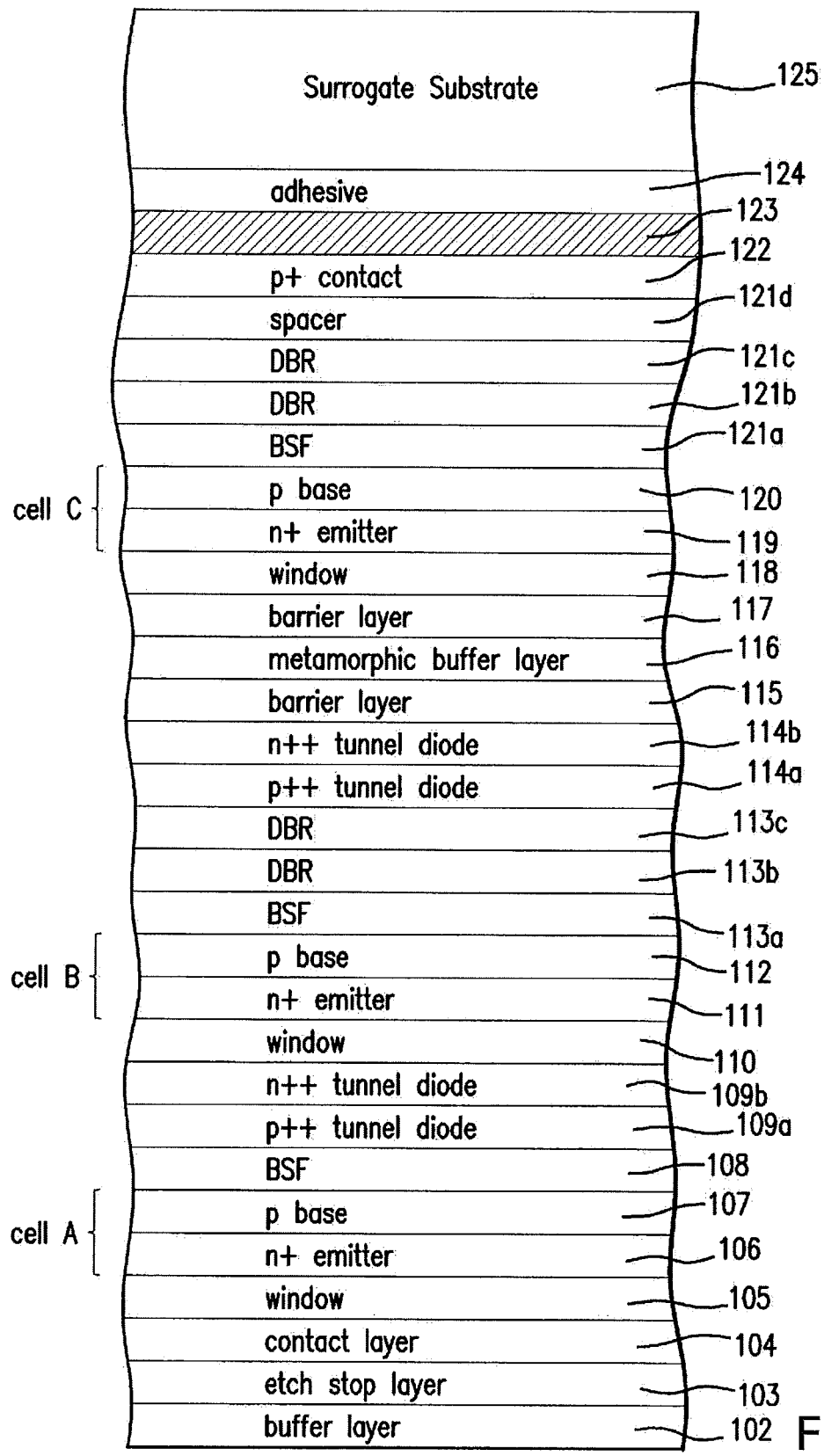
FIG. 5B is a cross-sectional view of the solar cell of FIG. 5A after the next process step in which the original substrate is removed.

FIG. 5B is a cross-sectional view of the solar cell of FIG. 5A after the next process step in which the original substrate is removed by a sequence of lapping and/or etching steps in which the substrate 101, and the buffer layer 103 are removed. The choice of a particular etchant is growth substrate dependent.

Figure 5C:
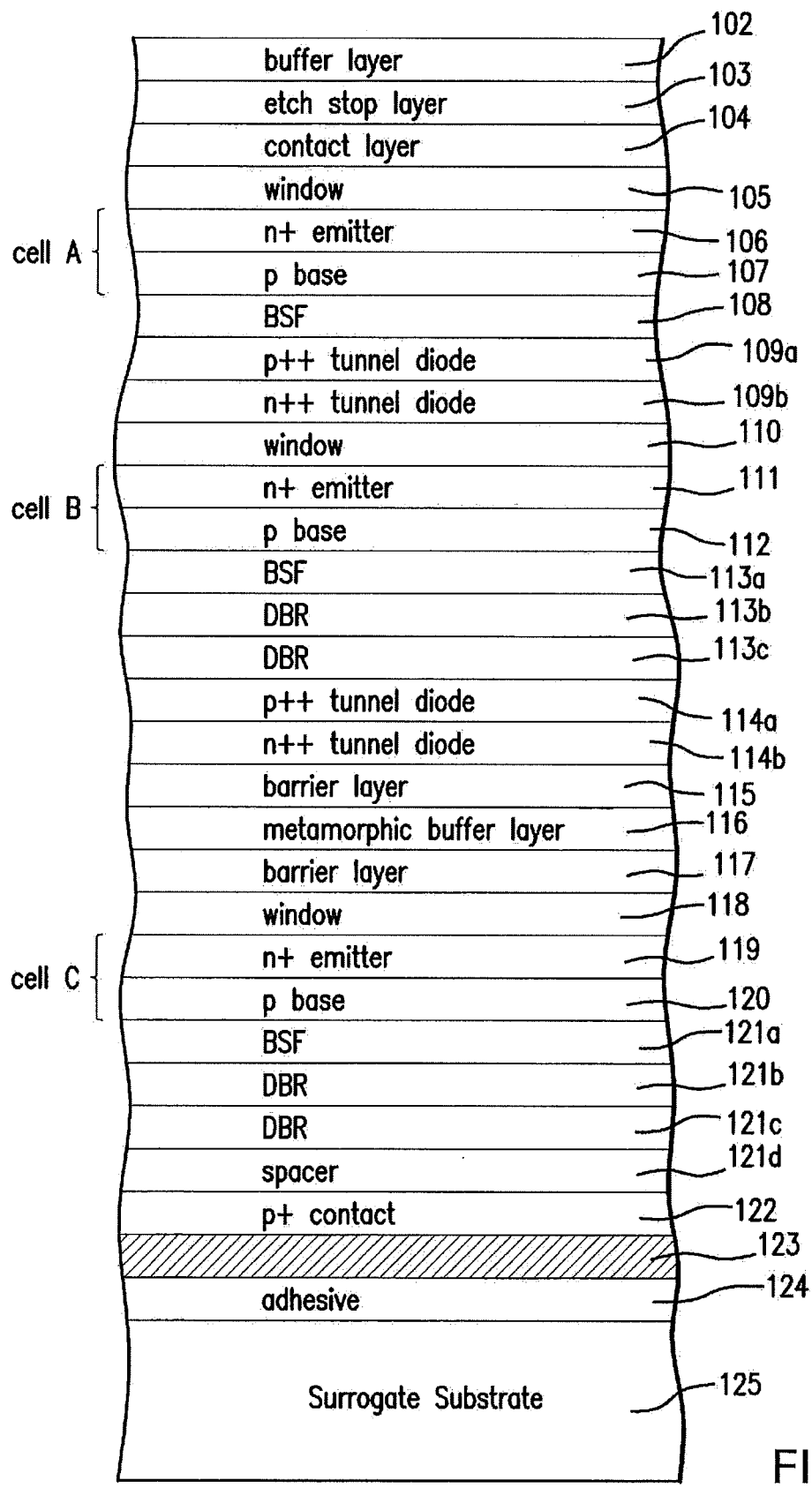
FIG. 5C is another cross-sectional view of the solar cell of FIG. 5B with the surrogate substrate on the bottom of the Figure.

FIG. 5C is a cross-sectional view of the solar cell of FIG. 5B with the orientation with the surrogate substrate 125 being at the bottom of the Figure. Subsequent Figures in this application will assume such orientation.

Figure 6:
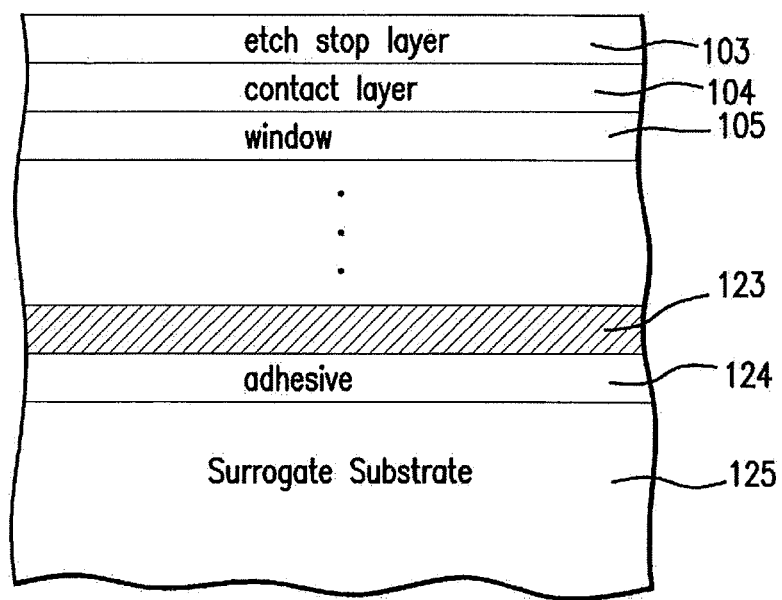
FIG. 6 is a simplified cross-sectional view of the solar cell of FIG. 5C after the next process step.

FIG. 6 is a simplified cross-sectional view of the solar cell of FIG. 5B depicting just a few of the top layers and lower layers over the surrogate substrate 125.

Figure 7:
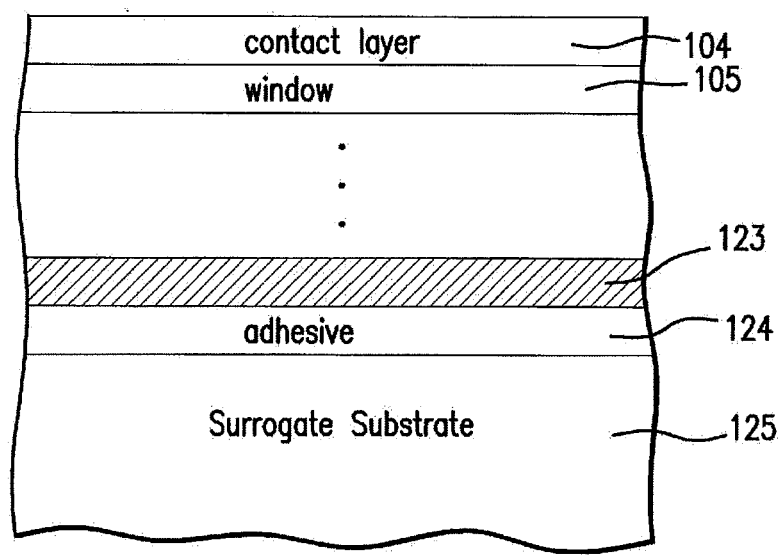
FIG. 7 is a cross-sectional view of the solar cell of FIG. 6 after the next process step.

FIG. 7 is a cross-sectional view of the solar cell of FIG. 6 after the next process step in which the etch stop layer 103 is removed by a HCl/H$_2$O solution.

Figure 8:
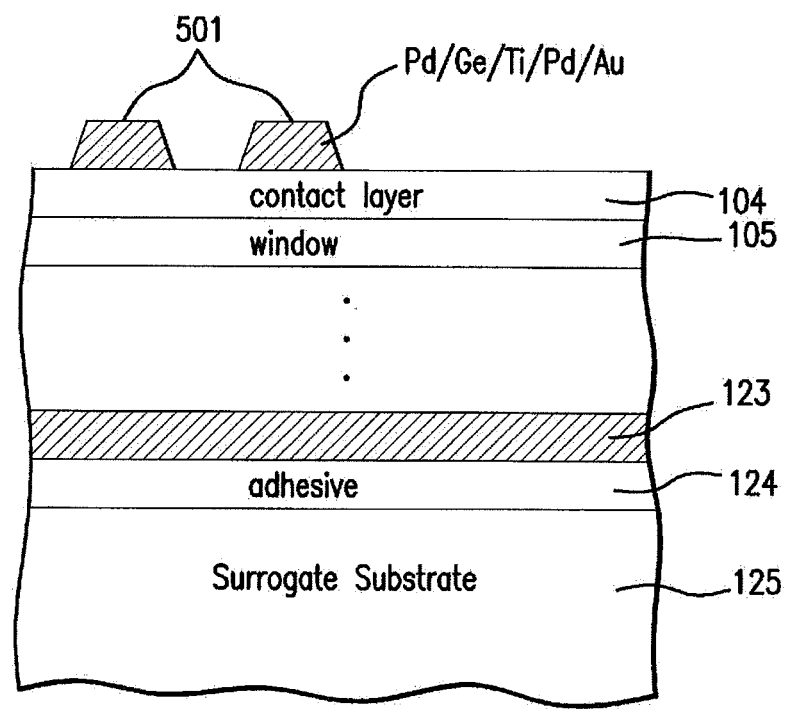
FIG. 8 is a cross-sectional view of the solar cell of FIG. 7 after the next process step.

FIG. 8 is a cross-sectional view of the solar cell of FIG. 7 after the next sequence of process steps in which a photoresist mask (not shown) is placed over the contact layer 104 to form the grid lines 501. As will be described in greater detail below, the grid lines 501 are deposited via evaporation and lithographically patterned and deposited over the contact layer 104. The mask is subsequently lifted off to form the finished metal grid lines 501 as depicted in the Figures.

As more fully described in U.S. Patent Application No. 2010/0012175 A1 (Varghese et al.), hereby incorporated by reference, the grid lines 501 are preferably composed of the sequence of layers Pd/Ge/Ti/Pd/Au, although other suitable sequences and materials may be used as well.

Figure 9:
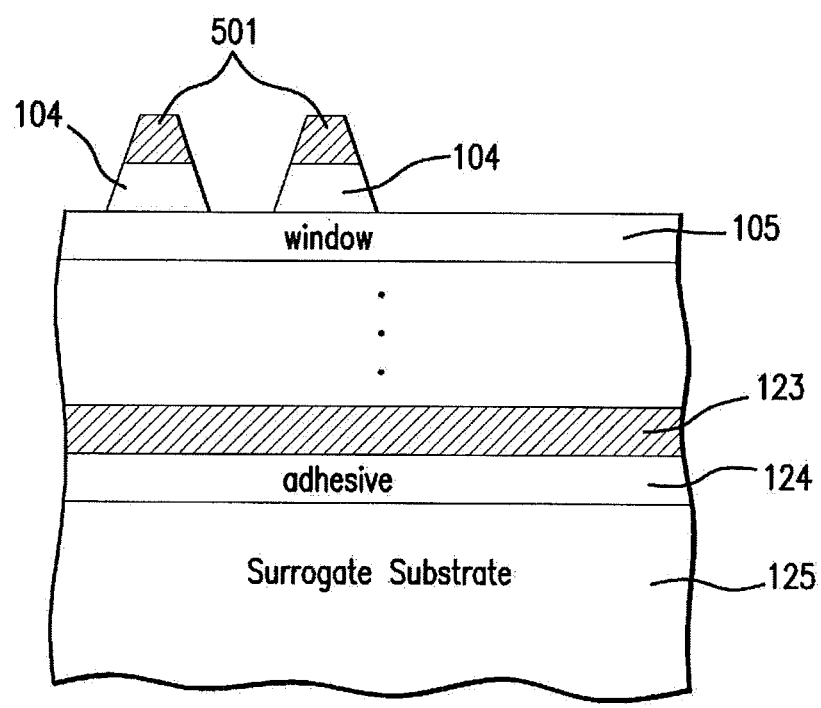
FIG. 9 is a cross-sectional view of the solar cell of FIG. 8 after the next process step.

FIG. 9 is a cross-sectional view of the solar cell of FIG. 8 after the next process step in which the grid lines are used as a mask to etch down the surface to the window layer 105 using a citric acid/peroxide etching mixture.

Figure 10A:
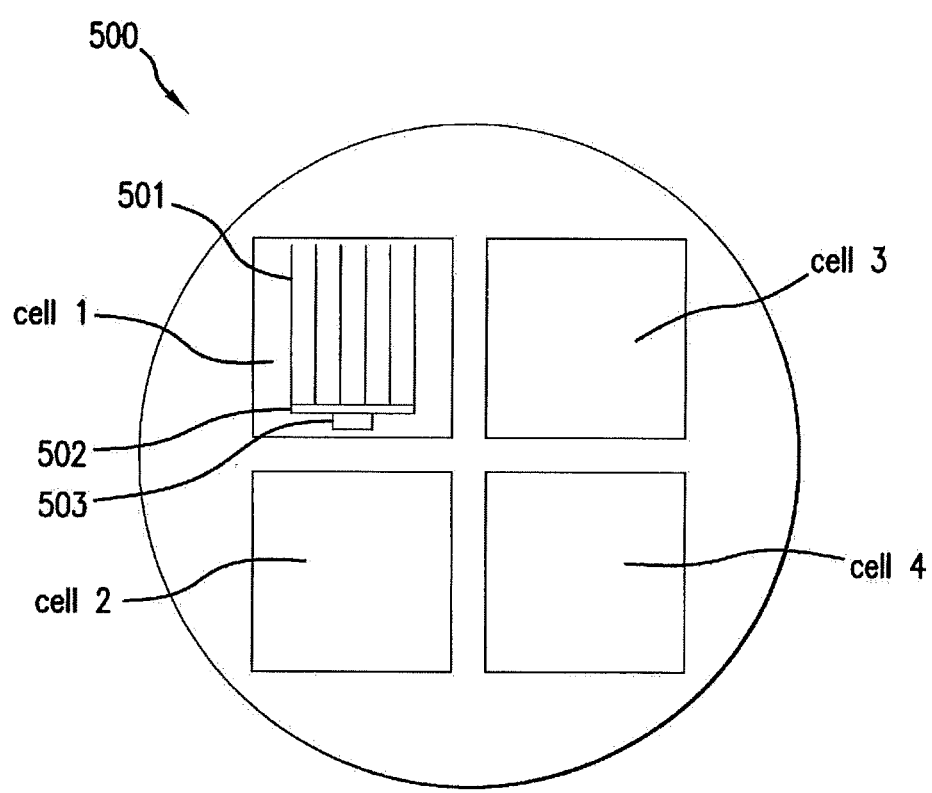
FIG. 10A is a top plan view of a wafer in which four solar cells are fabricated.

FIG. 10A is a top plan view of a wafer in which four solar cells are implemented. The depiction of four cells is for illustration purposes only, and the present invention is not limited to any specific number of cells per wafer.

In each cell there are grid lines 501 (more particularly shown in cross-section in FIG. 9), an interconnecting bus line 502, and a contact pad 503. The geometry and number of grid and bus lines and the contact pad are illustrative and the present invention is not limited to the illustrated embodiment.

Figure 10B:
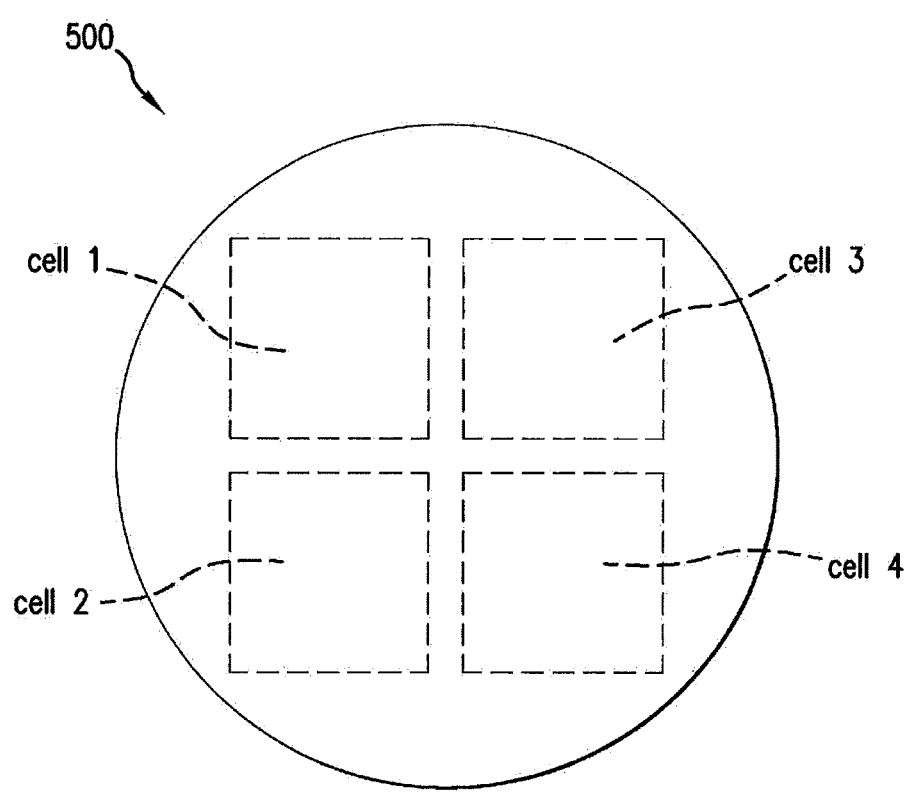
FIG. 10B is a bottom plan view of a wafer in which the solar cells are fabricated.

FIG. 10B is a bottom plan view of the wafer with four solar cells shown in FIG. 10A.

Figure 11:
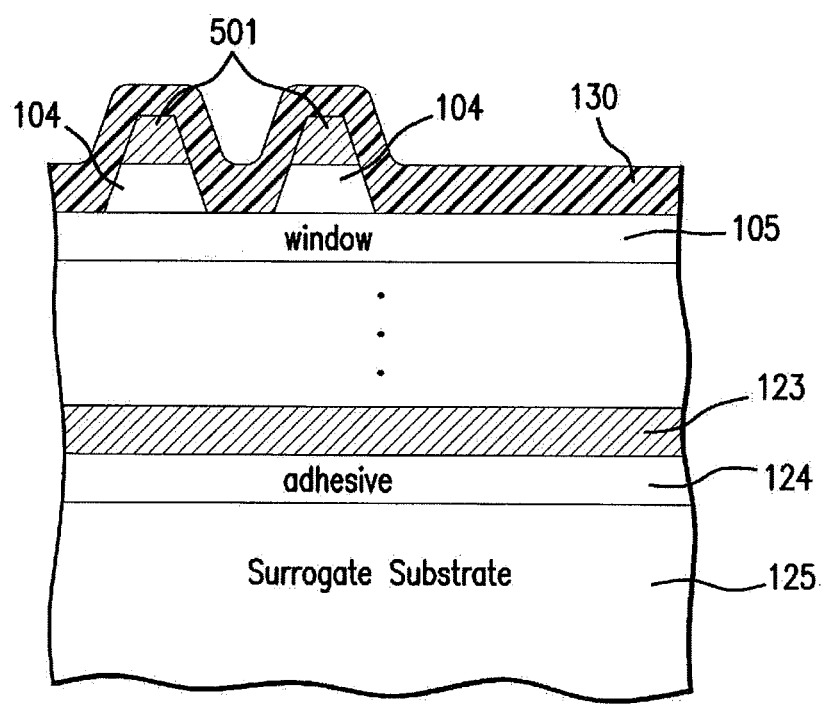
FIG. 11 is a cross-sectional view of the solar cell of FIG. 9 after the next process step.

FIG. 11 is a cross-sectional view of the solar cell of FIG. 9 after the next process step in which an antireflective (ARC) dielectric coating layer 130 is applied over the entire surface of the "bottom" side of the wafer with the grid lines 501.

Figure 12A:
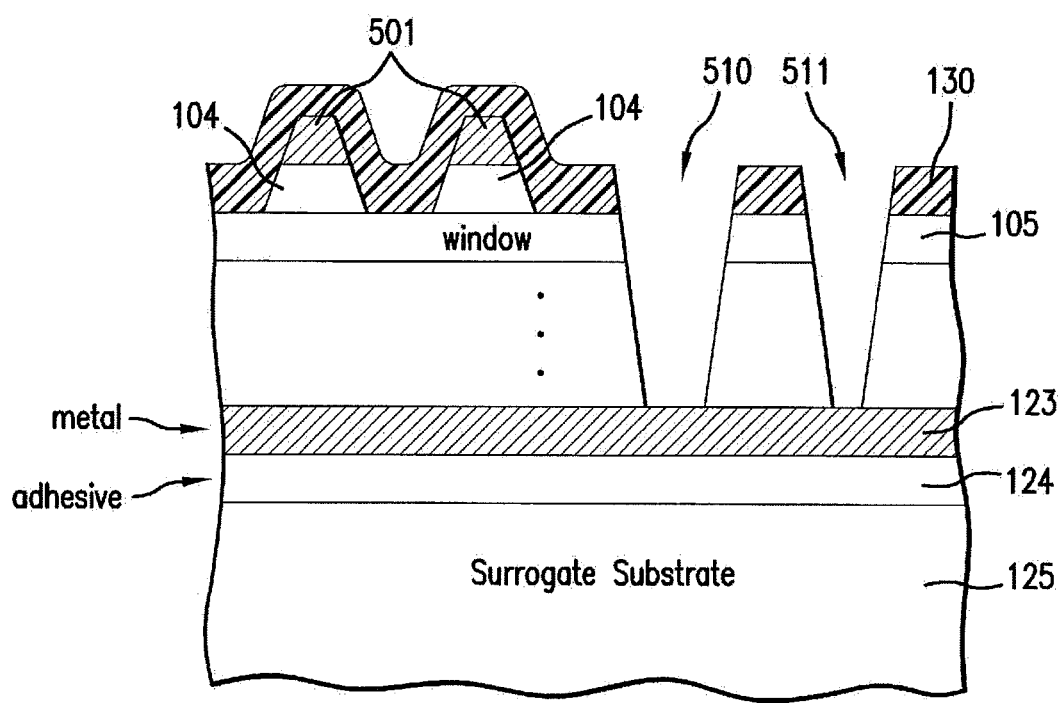
FIG. 12A is a cross-sectional view of the solar cell of FIG. 11 after the next process step.

FIG. 12A is a cross-sectional view of the solar cell of FIG. 11 after the next process step according to the present invention in which first and second annular channels 510 and 511, or portion of the semiconductor structure are etched down to the metal layer 123 using phosphide and arsenide etchants. These channels, as more particularly described in U.S. Pat. No. 7,741,146 B2 (Cornfeld et al.), define a peripheral boundary between the cell and the rest of the wafer, and leave a mesa structure which constitutes the solar cell. The cross-section depicted in FIG. 12A is that as seen from the A-A plane shown in FIG. 13. In one embodiment, channel 510 is substantially wider than that of channel 511.

Figure 12B:
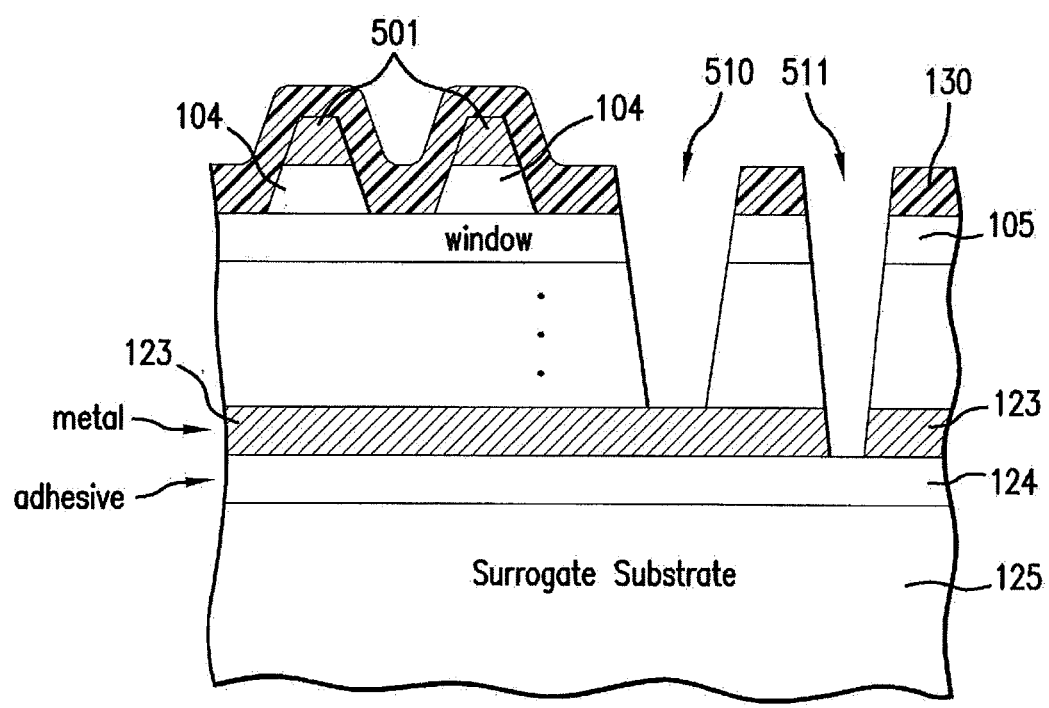
FIG. 12B is a cross-sectional view of the solar cell of FIG. 12A after the next process step.

FIG. 12B is a cross-sectional view of the solar cell of FIG. 12A after the next process step in which channel 511 is exposed to a metal etchant, layer 123 in the channel 511 is removed, and channel 511 is extended in depth approximately to the top surface of the adhesive layer 124.

Figure 13:
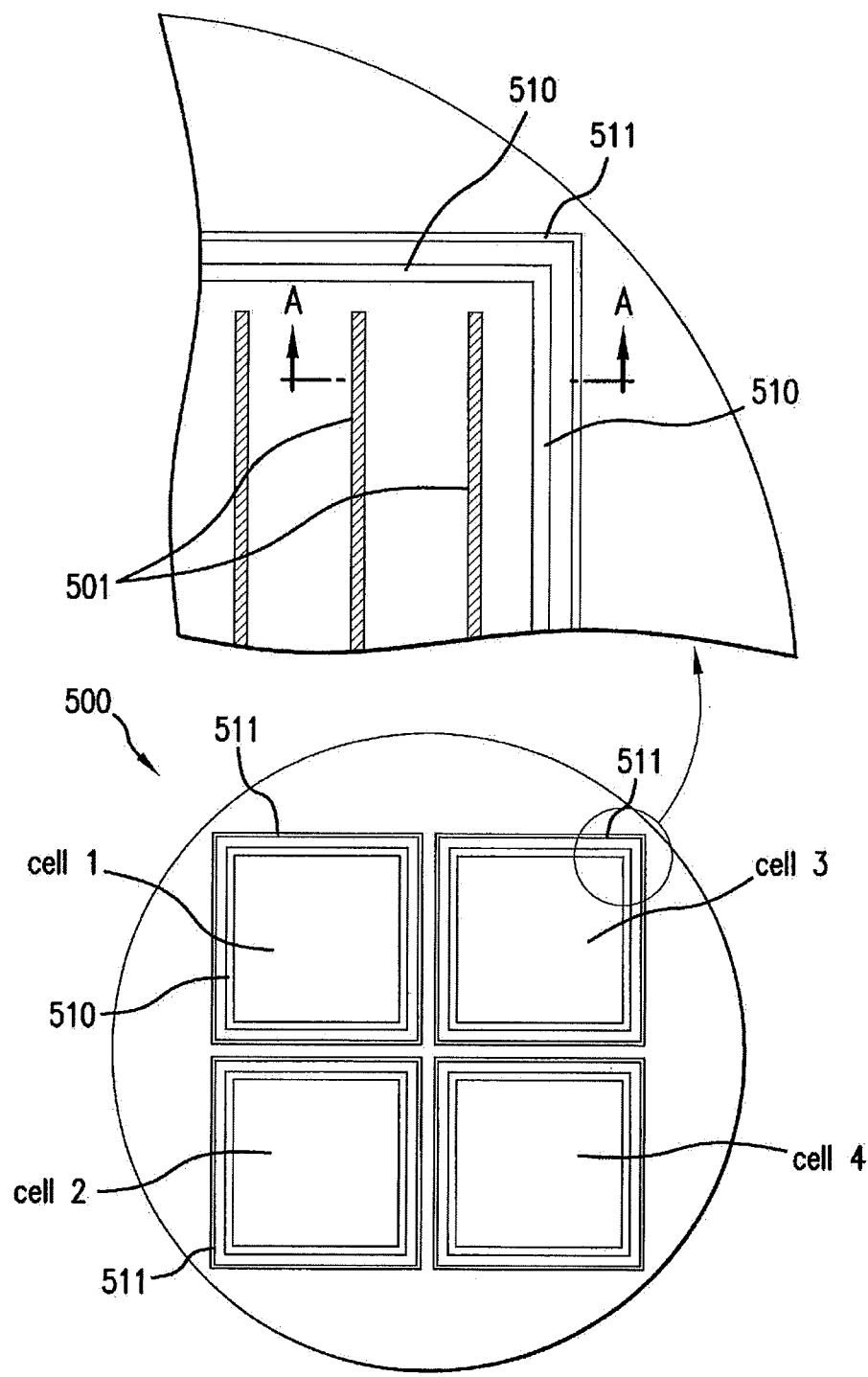
FIG. 13 is a top plan view of the wafer of FIG. 12B depicting the surface view of the trench etched around the cell, after the next process step.

FIG. 13 is a top plan view of the wafer of FIGS. 12A and 12B depicting the channels 510 and 511 etched around the periphery of each cell.

Figure 14A:
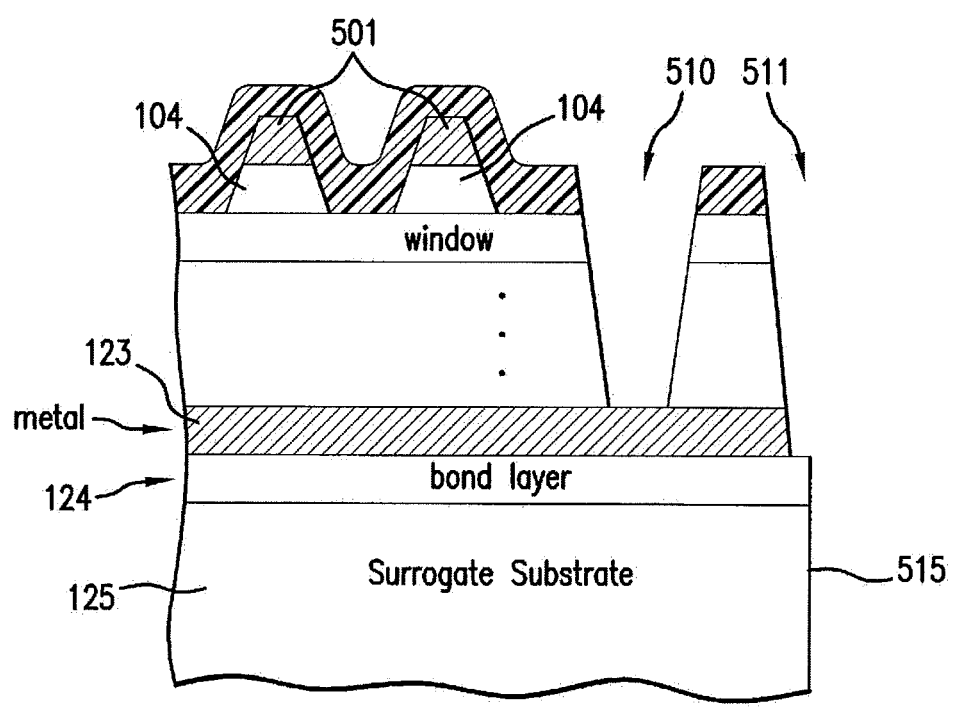
FIG. 14A is a cross-sectional view of the solar cell of FIG. 12B after the next process step in a first embodiment of the present invention.

FIG. 14A is a cross-sectional view of the solar cell of FIG. 12B after the individual solar cells (cell 1, cell 2, etc. shown in FIG. 13) are cut or scribed from the wafer through the channel 511, leaving a vertical edge 515 extending through the surrogate substrate 125 at the location of the channel 511. In this first embodiment of the present invention, the surrogate substrate 125 forms the support for the solar cell in applications where a cover glass (such as provided in the third embodiment to be described below) is not required. In such an embodiment, electrical contact to the metal contact layer 123 may be made through the channel 510.

Figure 14B:
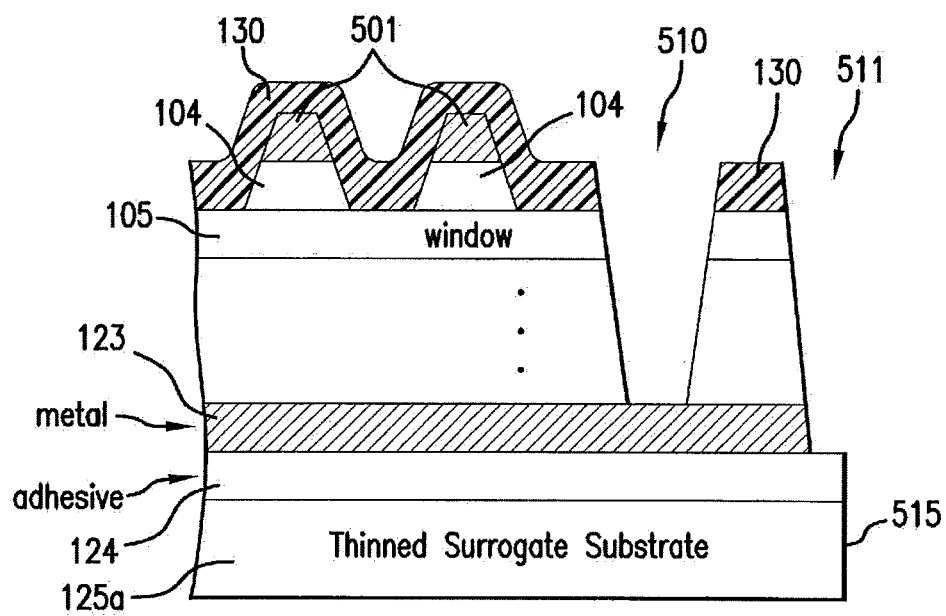
FIG. 14B is a cross-sectional view of the solar cell of FIG. 12B after the next process step in a second embodiment of the present invention.

FIG. 14B is a cross-sectional view of the solar cell of FIG. 12B after the next process step in a second embodiment of the present invention in which the surrogate substrate 125 is appropriately thinned to a relatively thin layer 125a, by grinding, lapping, or etching. The individual solar cells (cell 1, cell 2, etc. shown in FIG. 13) are cut or scribed from the wafer through the channel 511, leaving a vertical edge 515 extending through the surrogate substrate 125. In this embodiment, the thin layer 125a forms the support for the solar cell in applications where a cover glass, such as provided in the third embodiment to be described below, is not required. In such an embodiment, electrical contact to the metal contact layer 123 may be made through the channel 510.

Figure 14C:
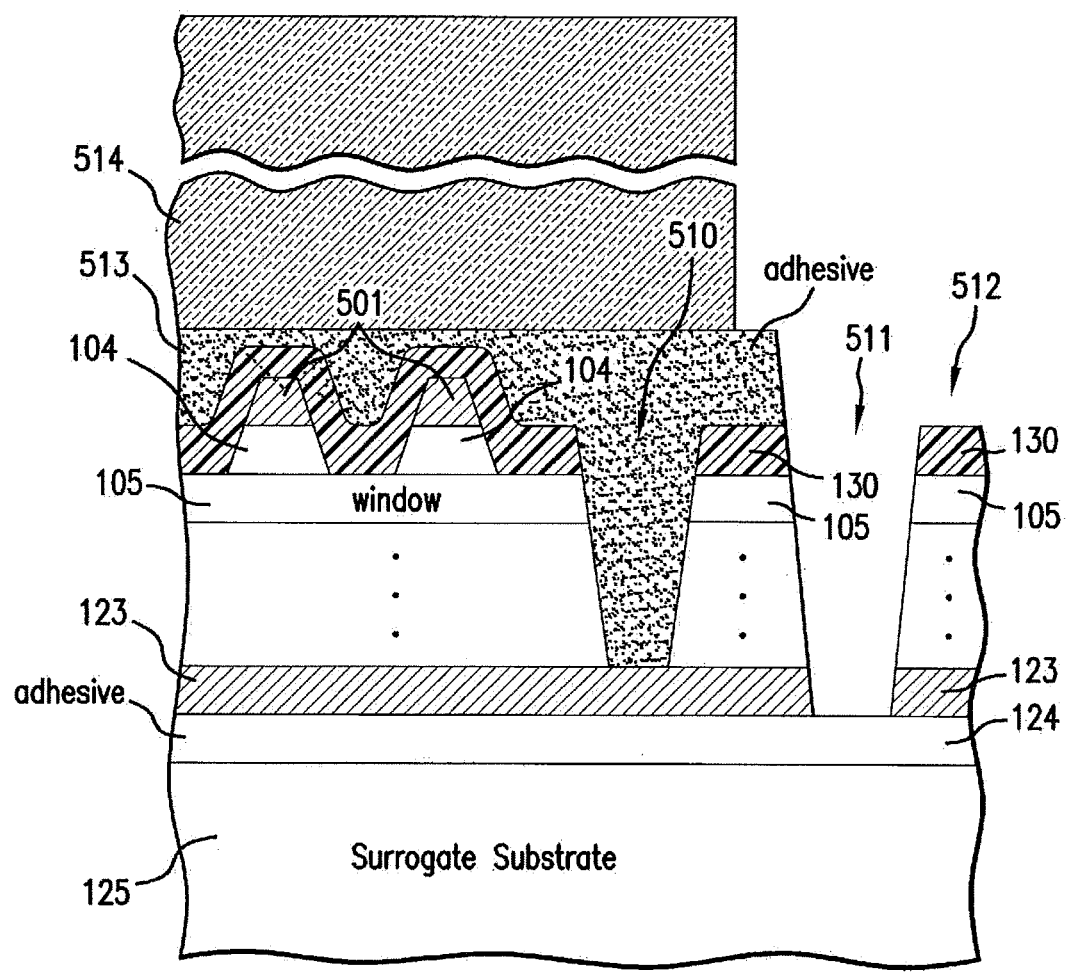
FIG. 14C is a cross-sectional view of the solar cell of FIG. 14B after the next process step in a third embodiment of the present invention.

FIG. 14C is a cross-sectional view of the solar cell of FIG. 12B after the next process step in a third embodiment of the present invention in which a cover glass 514 is secured to the top of the cell by an adhesive 513. The cover glass 514 is typically about 4 mils thick and preferably covers the entire channel 510, but does not extend to channel 511. Although the use of a cover glass is desirable for many environmental conditions and applications, it is not necessary for all implementations, and additional layers or structures may also be utilized for providing additional support or environmental protection to the solar cell.

Figure 15:
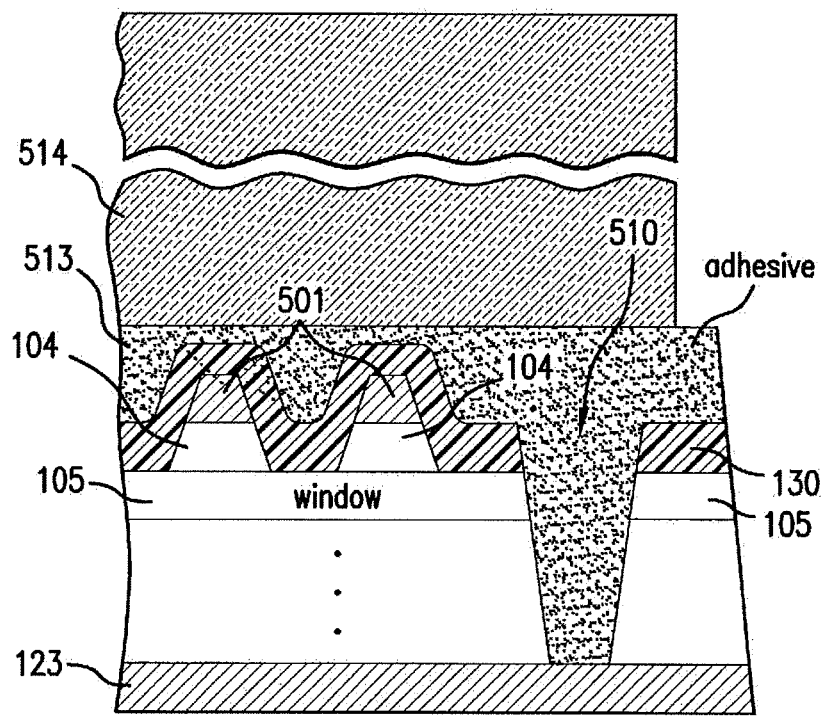
FIG. 15 is a cross-sectional view of the solar cell of FIG. 14C after the next process step in a third embodiment of the present invention.

FIG. 15 is a cross-sectional view of the solar cell of FIG. 14C after the next process step in some embodiments of the present invention in which the adhesive layer 124, the surrogate substrate 125 and the peripheral portion 512 of the wafer is entirely removed, leaving only the solar cell with the cover glass 514 (or other layers or structures) on the top, and the metal contact layer 123 on the bottom, which forms the backside contact of the solar cell. The surrogate substrate is preferably removed by the use of a suitable solvent. As noted above, the surrogate substrate includes perforations over its surface that allow the flow of solvent through the surrogate substrate 125 to permit its lift off. After lift off, the surrogate substrate may be reused in subsequent wafer processing operations.

Figure 16:
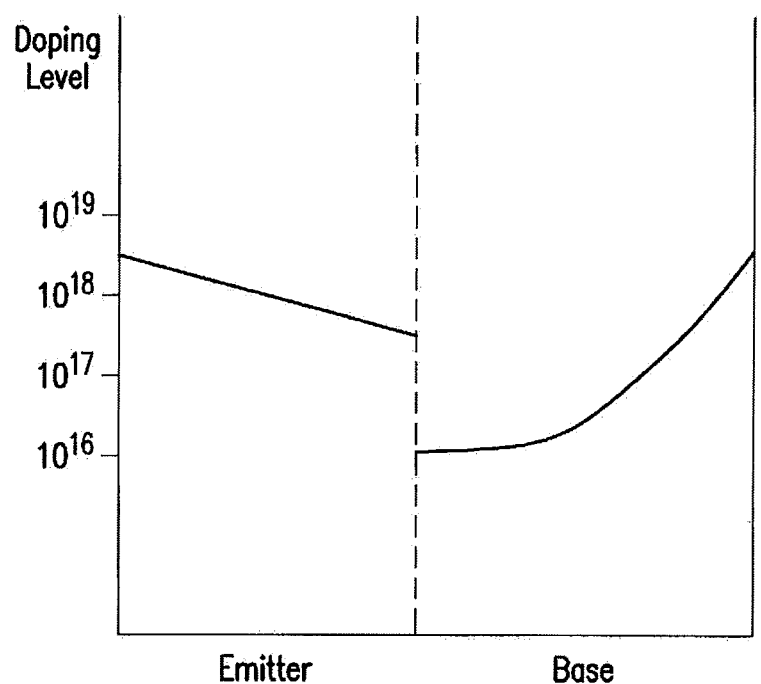
FIG. 16 is a graph of the doping profile in the base and emitter layers of a subcell in the metamorphic solar cell according to the present invention.

FIG. 16 is a graph of a doping profile in the emitter and base layers in one or more subcells of the inverted metamorphic multijunction solar cell of the present invention. The various doping profiles within the scope of the present invention, and the advantages of such doping profiles are more particularly described in copending U.S. Patent Application Pub. No. 2009/0155952 A1 (Stan et al.), herein incorporated by reference. The doping profiles depicted herein are merely illustrative, and other more complex profiles may be utilized as would be apparent to those skilled in the art without departing from the scope of the present invention.

It will be understood that each of the elements described above, or two or more together, also may find a useful application in other types of constructions differing from the types of constructions described above.

Although one embodiment of the present invention utilizes a vertical stack of three subcells, the present invention can apply to stacks with fewer or greater number of subcells, i.e. two junction cells, four junction cells, five junction cells, etc. as more particularly described in U.S. Pat. No. 8,236,600 B2 (Cornfeld). In the case of four or more junction cells, the use of more than one metamorphic grading interlayer may also be utilized, as more particularly described in U.S. Patent Application Pub. No. 2010/0122724 A1 (Cornfeld et al.).

In addition, although the present embodiment is configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photo generated current density in each subcell can be used effectively, leading to high efficiency for the multijunction cell, notwithstanding that the photogenerated current densities are typically different in the various subcells.

As noted above, the present invention may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n-type InGaP is one example of a homojunction subcell. Alternatively, as more particularly described in U.S. Patent Application Pub. No. 2009/0078310 A1 (Stan et al.), the present invention may utilize one or more, or all, heterojunction cells or subcells, i.e., a cell or subcell in which the p-n junction is formed between a p-type semiconductor and an n-type semiconductor having different chemical compositions of the semiconductor material in then-type regions, and/or different band gap energies in the p-type regions, in addition to utilizing different dopant species and type in the p-type and n-type regions that form the p-n junction.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness. Some such configurations are more particularly described in copending U.S. Patent Application Pub. No. 2009/0272438 A1 (Cornfeld).

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the invention has been illustrated and described as embodied in an inverted metamorphic multijunction solar cell, it is not intended to be limited to the details shown, since various modifications and structural changes may be made without departing in any way from the spirit of the present invention.

Thus, while the description of this invention has focused primarily on solar cells or photovoltaic devices, persons skilled in the art know that other optoelectronic devices, such as, thermophotovoltaic (TPV) cells, photodetectors and light-emitting diodes (LEDS) are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the foregoing others can, by applying current knowledge, readily adapt the present invention for various applications. Such adaptations should and are intended to be comprehended within the meaning and range of equivalence of the following claims.

The invention claimed is:

1. An inverted metamorphic multijunction solar cell comprising:
   an upper first solar subcell having a first band gap;
   a middle second solar subcell disposed adjacent to the upper first solar subcell and having a second band gap smaller than said first band gap;
   a graded interlayer disposed adjacent to the middle second solar subcell and having a band gap that remains constant throughout its thickness;
   a lower third solar subcell disposed adjacent to said graded interlayer and having a fourth band gap that is smaller than said second band gap such that said third solar subcell is lattice mismatched with respect to said second solar subcell; the lower third solar subcell having an emitter layer and a base layer disposed below the emitter layer;
   a back surface field (BSF) layer disposed directly adjacent to the base layer of said lower third solar subcell;
   at least one distributed Bragg reflector (DBR) layer disposed directly adjacent to the back surface field (BSF) layer that is disposed directly adjacent the base layer of said lower third solar subcell;
   a spacer layer composed of p+ InGaAlAs disposed directly adjacent the at least one distributed Braff reflector layer; and
   a high band gap contact layer composed of InGaAlAs disposed directly adjacent to the spacer layer.

2. A multijunction solar cell as defined in claim 1, wherein the at least one distributed Bragg reflector layer is composed of a plurality of alternating layers of lattice matched materials with discontinuities in their respective indices of refraction.

3. A multijunction solar cell as defined in claim 1, wherein the at least one DBR layer includes a first DBR layer composed of p type $Al_xGa_{1-x}As$ and a second directly adjacent DBR layer disposed over the first DBR layer and composed of p type $Al_yGa_{1-y}As$, where 0<x<1, 0<y<1, and y is greater than x.

4. A multijunction solar cell as defined in claim 1, wherein said graded interlayer is composed of any of the As, N, Sb based III-V compound semiconductors subject to the constraints of having the in-plane lattice parameter greater or equal to that of the upper first solar subcell and less than or equal to that of the middle second solar subcell, and having a band gap energy greater than that of the second solar subcell, and the band gap of said graded interlayer remains constant at approximately 1.50 eV throughout its thickness.

5. A multijunction solar cell as defined in claim 1, wherein said graded interlayer is composed of $(In_xGa_{1-x})_yAl_{1-y}As$ with 0<x<1, 0<y<1, and x and y selected such that the band gap of said graded interlayer remains constant throughout its thickness; and wherein said graded interlayer is deposited using trimethylgallium, trimethylindium, and arsine as precursor compounds in the MOCVD process.

6. A multijunction solar cell as defined in claim 1, wherein the middle second solar subcell is composed of an GaInP, GaAs, GaInAs, GaInAsN emitter region and an GaAs, GaInAs, GaAsSb, or GaInAsN base region, and the lower third solar subcell is composed of InGaAs base and emitter regions.

7. A multijunction solar cell as defined in claim 1, wherein the lower third solar subcell is composed of an InGaP emitter layer and an InGaAs base layer, or a InGaAs emitter layer and a InGaAs base layer.

8. A multijunction solar cell as defined in claim 1, wherein the upper first solar subcell is grown on a first substrate is composed of gallium arsenide or germanium.

9. A method of manufacturing a multijunction solar cell as defined in claim 8, wherein the first substrate is removed after growth of all of the semiconductor layers by grinding, lapping, or etching.

10. An inverted metamorphic multijunction solar cell including an upper solar subcell, a middle solar subcell, and a lower solar subcell comprising:
   an upper first solar subcell having a first band gap
   a middle second solar subcell disposed adjacent to the upper first solar subcell and having a second band gap smaller than said first band gap, and having an emitter layer and a base layer disposed below the emitter layer;
   a first back surface field (BSF) layer disposed directly adjacent the base layer of said middle second solar subcell;

a first distributed Bragg reflector (DBR) layer disposed directly adjacent the first back surface field (BSF) layer that is directly adjacent the base layer of said middle second solar subcell;

a graded interlayer over the first distributed Bragg reflector layer wherein a band gap of the interlayer remains constant throughout its thickness;

a lower third solar subcell disposed adjacent to said graded interlayer and having a fourth band gap smaller than said second band gap such that said third solar subcell is lattice mismatched with respect to said middle second solar subcell;

a second back surface field (BSF) layer disposed directly adjacent a base layer of said lower third solar subcell;

a second distributed Bragg reflector disposed directly adjacent the second back surface field (BSF) layer that is directly adjacent the base layer of said lower third solar subcell;

a spacer layer composed of p+ InGaAlAs disposed directly adjacent the second distributed Bragg reflector layer;

a high band gap contact layer composed of InGaAlAs disposed directly adjacent the spacer layer;

wherein light can enter the upper first solar subcell, pass through the middle second solar subcell and the directly adjacent back surface field (BSF) layer, and be reflected by the first directly adjacent distributed Bragg reflector layer back into the middle second solar subcell; and wherein light can enter the upper first solar subcell, pass through the middle second solar subcell, the lower third solar subcell, and the directly adjacent back surface field (BSF) layer, and be reflected by the second directly adjacent distributed Bragg reflector layer back into the lower third solar subcell.

11. A multijunction solar cell as defined in claim 10, wherein the upper first solar subcell is composed of InGa(Al)P.

12. A multijunction solar cell as defined in claim 10, wherein the middle second solar subcell is composed of an GaAs, GaInP, GaInAs, GaAsSb, or GaInAsN emitter region and a GaAs, GaInAs, GaAsSb, or GaInAsN base region.

13. A multijunction solar cell as defined in claim 10, wherein the lower third solar subcell is composed of an InGaAs base and emitter layer, or InGaAs base layer and a InGaP emitter layer.

14. A multijunction solar cell as defined in claim 10, wherein the graded interlayer is compositionally graded to lattice match the middle second solar subcell on one side and the lower third solar subcell on the other side, and is composed of $(In_xGa_{1-x})_yAl_{1-y}As$ with $0<x<1$, $0<y<1$, and x and y selected such that the band gap of the interlayer remains constant throughout its thickness and greater than said second band gap; and wherein said graded interlayer is deposited using trimethylgallium, trimethylindium, and arsine as precursor compounds in an MOCVD process.

15. A multijunction solar cell as defined in claim 10, wherein the graded interlayer has approximately a 1.5 eV band gap throughout its thickness.

16. A multijunction solar cell as defined in claim 10, wherein the graded interlayer is composed of any of the As, N, Sb based III-V compound semiconductors subject to the constraints of having the in-plane lattice parameter greater or equal to that of the middle second solar subcell and less than or equal to that of the lower third solar cell, and having a band gap energy greater than that of the middle second solar subcell.

17. A multijunction solar cell as defined in claim 10, further comprising forming a metal contact layer over the high band gap contact layer.

* * * * *